United States Patent
Iwase et al.

(10) Patent No.: US 11,631,713 B2
(45) Date of Patent: Apr. 18, 2023

(54) INFORMATION PROCESSING DEVICE, INFORMATION PROCESSING METHOD, IMAGE CAPTURING DEVICE, AND PROGRAM

(71) Applicant: SONY CORPORATION, Tokyo (JP)

(72) Inventors: Akira Iwase, Tokyo (JP); Yoshitaka Miyatani, Tokyo (JP); Kouji Yamamoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 305 days.

(21) Appl. No.: 16/754,592

(22) PCT Filed: Oct. 19, 2018

(86) PCT No.: PCT/JP2018/038920
§ 371 (c)(1),
(2) Date: Apr. 8, 2020

(87) PCT Pub. No.: WO2019/078319
PCT Pub. Date: Apr. 25, 2019

(65) Prior Publication Data
US 2020/0295073 A1     Sep. 17, 2020

(30) Foreign Application Priority Data
Oct. 19, 2017   (JP) .............................. JP2017-202354

(51) Int. Cl.
*H01L 27/14* (2006.01)
*H01L 27/146* (2006.01)
(Continued)

(52) U.S. Cl.
CPC .. *H01L 27/14643* (2013.01); *H01L 27/14609* (2013.01); *H04N 5/3452* (2013.01); *H04N 5/351* (2013.01); *H04N 5/379* (2018.08)

(58) Field of Classification Search
CPC ........ H01L 27/14643; H01L 27/14609; H04N 5/3452; H04N 5/351; H04N 5/379;
(Continued)

(56) References Cited

U.S. PATENT DOCUMENTS

2007/0223824 A1   9/2007   Kato et al.
2016/0126275 A1   5/2016   Kurokawa
2018/0027201 A1   1/2018   Sankaranarayanan et al.

FOREIGN PATENT DOCUMENTS

CN   101031021 A   9/2007
CN   102612834 A   7/2012
(Continued)

OTHER PUBLICATIONS

Asif et al, Faitcam: Thin, Lensless Cameras using coded aperture and computation, Sep. 2017, IEEE transactions on computational imaging, vol. 3, No. 3, pp. 384-397 (Year: 2017).*

(Continued)

*Primary Examiner* — Tony Ko
(74) *Attorney, Agent, or Firm* — Oblon, McClelland, Maier & Neustadt, L.L.P.

(57) ABSTRACT

In an information compression unit 311, in an image capturing unit 121 (221), among a plurality of pixel output units that receives object light that enters without passing through any of an image capturing lens and a pinhole, pixel outputs of at least two of the pixel output units have incident angle directivity modulated into different incident angle directivity according to an incident angle of the object light. The information compression unit 311 performs compression
(Continued)

processing to reduce an amount of data of pixel output information generated by the image capturing unit 121 (221). For example, by computation of a difference between set reference value information and the pixel output information, linear calculation of a set calculation parameter and the pixel output information, and the like, the information compression unit 311 reduces a word length of the pixel output information, and reduces the amount of data of the pixel output information generated according to the object light that enters without passing through any of an image capturing lens and a pinhole.

14 Claims, 31 Drawing Sheets

(51) Int. Cl.
    *H04N 5/369*     (2011.01)
    *H04N 5/345*     (2011.01)
    *H04N 5/351*     (2011.01)

(58) Field of Classification Search
    CPC ........ H04N 5/235; H04N 5/225; H04N 5/232; H04N 5/369; H04N 19/98
    See application file for complete search history.

(56) References Cited

FOREIGN PATENT DOCUMENTS

| EP | 1 841 233 A1 | 10/2007 |
|---|---|---|
| JP | 2007-228515 A | 9/2007 |
| JP | 2009-38740 A | 2/2009 |
| JP | 2016-510910 A | 4/2016 |
| JP | 2016-92413 A | 5/2016 |
| WO | WO 2016/123529 A1 | 8/2016 |
| WO | WO 2017/056865 A1 | 4/2017 |

OTHER PUBLICATIONS

International Search Report dated Dec. 11, 2018 in PCT/JP2018/038920 filed on Oct. 19, 2018, 2 pages.

Asif, M. S. et al., "FlatCam: Replacing Lenses with Masks and Computation," 2015 IEEE International Conference on Computer Vision Workshop (ICCVW), 2015, pp. 12-15.

Extended European Search Report dated Jul. 9, 2020 in European Patent Application No. 18867663.9, 10 pages.

Asif, M.S., et al., "FlatCam: Thin, Bare-Sensor Cameras using Coded Aperture and Computation", Retrieved from the Internet: URL: http://arxiv.org/pdf/1509.00116v2.pdf, XP055250990, pp. 1-12.

\* cited by examiner

FIG. 5
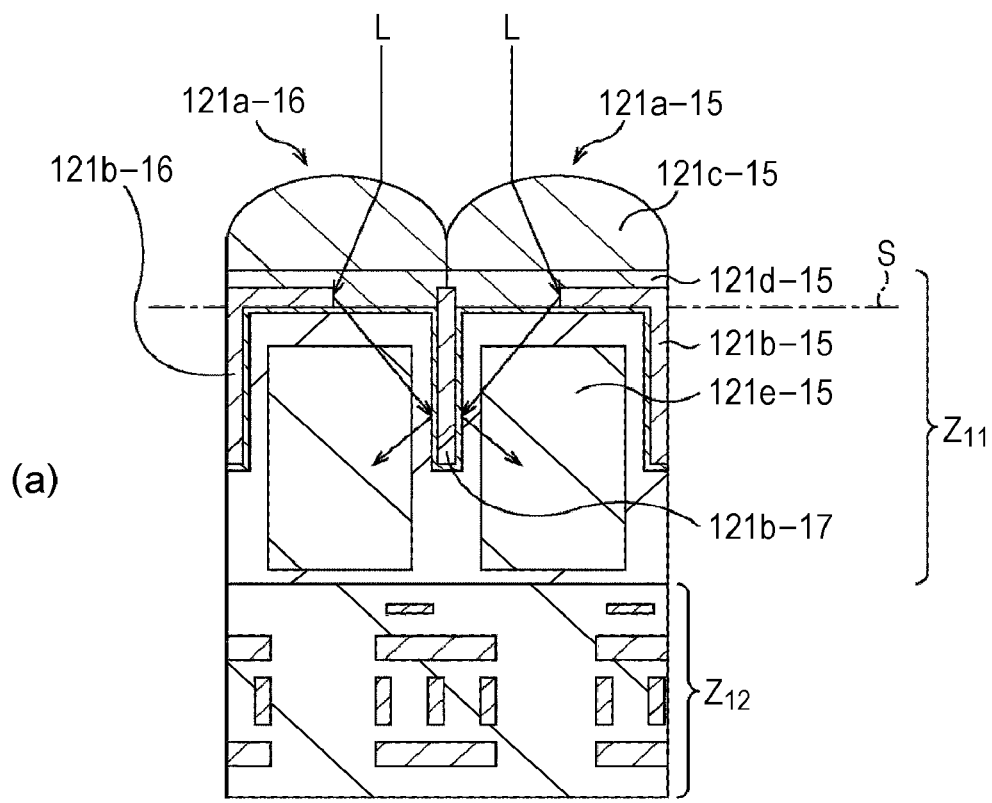
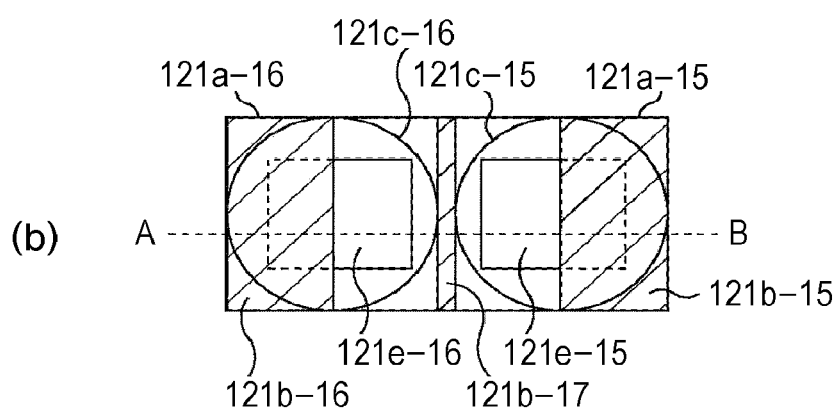

FIG. 6
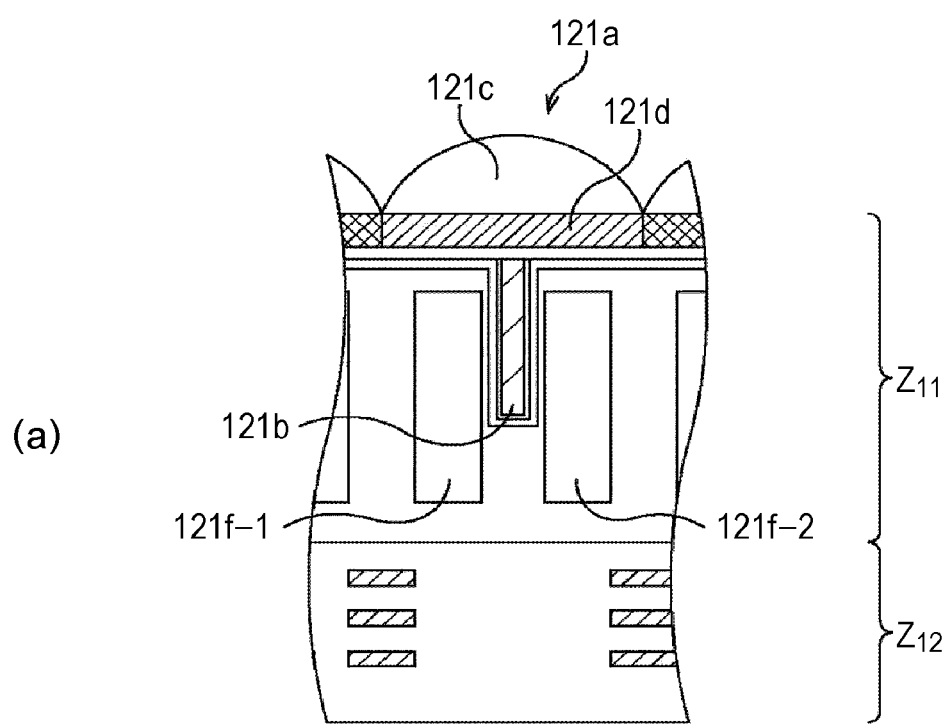
(a)
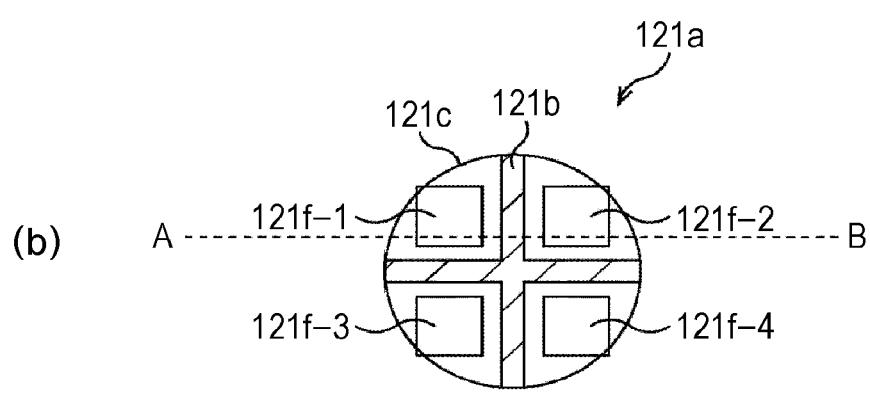
(b)

FIG. 7
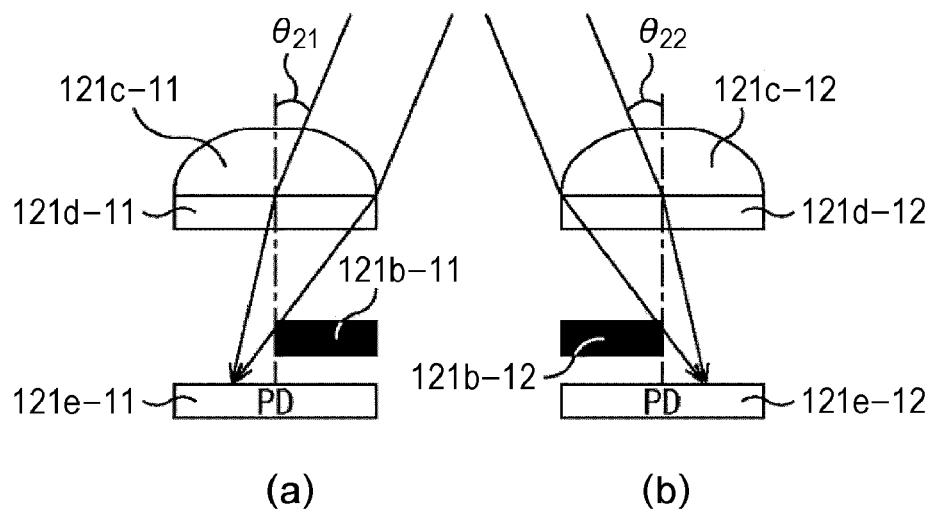
(a)    (b)
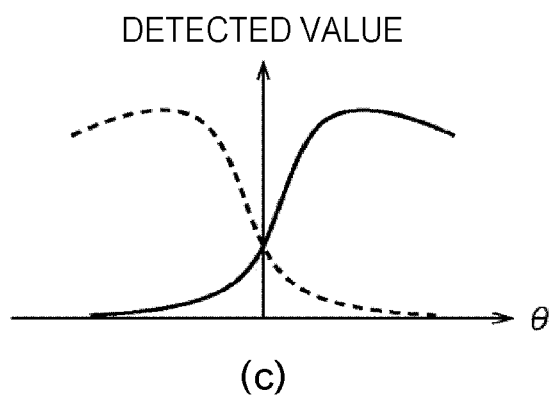
(c)

FIG. 9
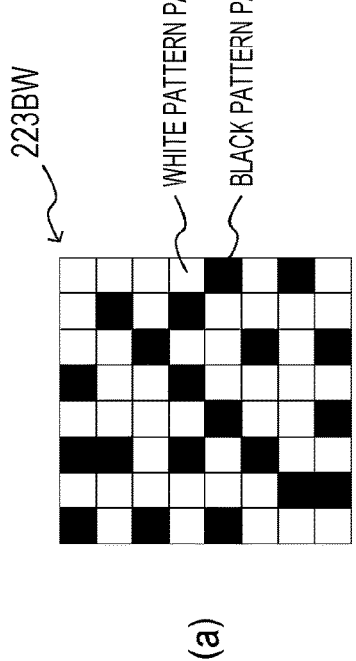
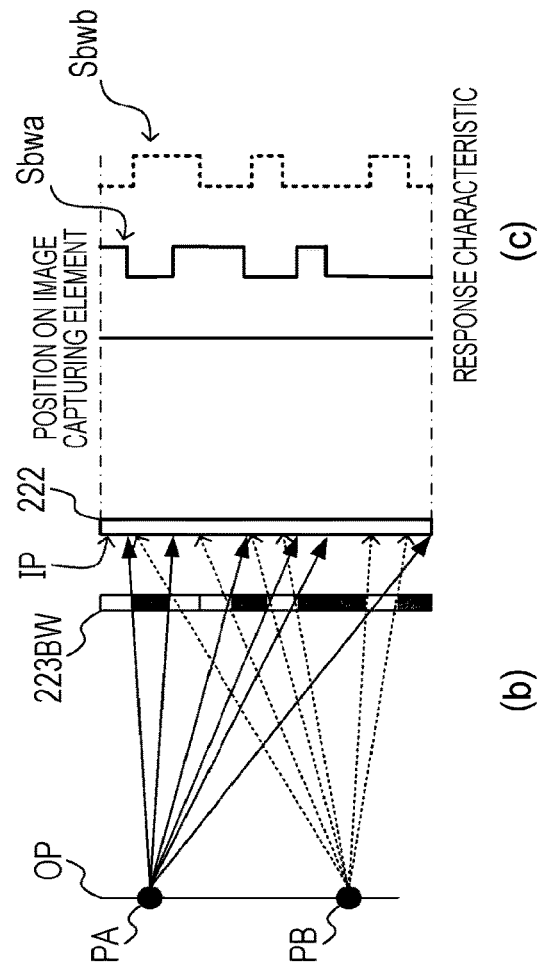

INFORMATION PROCESSING DEVICE, INFORMATION PROCESSING METHOD, IMAGE CAPTURING DEVICE, AND PROGRAM

TECHNICAL FIELD

The present disclosure relates to an information processing device, an information processing method, an image capturing device, and a program, and reduces an amount of data of pixel output information generated according to object light that enters without passing through any of an image capturing lens and a pinhole.

BACKGROUND ART

As a configuration of an image capturing device, a configuration in which an image capturing lens and an image capturing element are combined and a configuration in which a pinhole and an image capturing element are combined are generally well known.

The configuration in which the image capturing lens and the image capturing element are combined is adopted in most current image capturing devices. Light from an object is collected by the image capturing lens, an object optical image is formed on an image capturing plane of the image capturing element, and the image capturing element generates an image signal according to the object optical image by photoelectric conversion. In this way, the image capturing device having the configuration in which the image capturing lens and the image capturing element are combined is affected by an aberration of the image capturing lens, and the image capturing lens is an essential component. Therefore, there is a limit to miniaturization of the image capturing device.

Meanwhile, since the configuration in which the pinhole and the image capturing element are combined does not use the image capturing lens that collects light from an object, the amount of light that reaches the image capturing plane of the image capturing element is small. Therefore, processing such as prolonging time of exposure to light or increasing the gain is required, and this configuration is not suitable for general use, and is not particularly suitable for high-speed image capturing.

Therefore, for example, Patent Document 1 proposes an image capturing device having a configuration of combining a filter including a diffraction grating and an image capturing element to capture light from an object as a pattern obtained through the filter including the diffraction grating, and reproduce an object image by calculation processing using the pattern resulting from the image capturing. Furthermore, the image capturing element that does not use an image capturing lens is also proposed in Patent Document 2 and Non-Patent Document 1.

CITATION LIST

Patent Document

Patent Document 1: WO 2016/123529
Patent Document 2: Japanese Patent Application Laid-Open No. 2016-510910

Non-Patent Document

Non-Patent Document 1: M. Salman Asif and four others, "Flatcam: Replacing lenses with masks and computation", "2015 IEEE International Conference on Computer Vision Workshop (ICCVW)", 2015, pp 663-666

SUMMARY OF THE INVENTION

Problems to be Solved by the Invention

In that connection, the image capturing device as described above without using the image capturing lens does not generate the image signal by performing photoelectric conversion on the object optical image formed on the image capturing plane, and generates information different from information generated by the image capturing device in which the image capturing lens and the image capturing element are combined.

Therefore, an objective of this technology is to provide an information processing device, an information processing method, an image capturing device, and a program that can reduce an amount of data of pixel output information generated according to object light that enters without passing through any of an image capturing lens and a pinhole.

Solutions to Problems

A first aspect of this technology is
an information processing device including: an information compression unit configured to perform compression processing to reduce an amount of data of pixel output information including a plurality of pixel outputs that is output from an image capturing element including the plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light.

In this technology, the information compression unit performs the compression processing to reduce the amount of data of the pixel output information including a plurality of pixel outputs that is output from the image capturing element. The image capturing element includes the plurality of pixel output units configured to receive the object light that enters without passing through any of an image capturing lens and a pinhole, and among the plurality of pixel output units, the pixel outputs of at least two of the pixel output units have incident angle directivity modulated into different incident angle directivity according to the incident angle of the object light.

The information compression unit classifies, for example, each of the plurality of pixel outputs into one of a plurality of classifications on the basis of the incident angle directivity, and performs the compression processing on each classification. The information compression unit computes a difference between reference value information and the pixel outputs as the compression processing. The reference value information may be set on the basis of the pixel outputs, or the pixel output immediately before may be set as the reference value information. Furthermore, the information compression unit may reduce a word length of the pixel output information by performing linear calculation on a calculation parameter set on the basis of the pixel outputs and the pixel outputs, and the information compression unit discriminates a compression word length of the pixel output information after the compression processing, and controls exposure on the basis of the discriminated compression word length. Furthermore, the information compression unit performs the compression processing for each color component.

Furthermore, the information processing device may further include an image conversion unit configured to generate a reconstruction image that allows visual recognition of the object by using one of the pixel output information that has undergone the compression processing by the information compression unit, the pixel output information after expansion processing of the pixel output information that has undergone the compression processing, and the pixel output information before the compression processing. Furthermore, the information compression unit discriminates, for example, a word length of the pixel output information, controls generation of the pixel output information on the basis of a discrimination result, and sets the generated pixel output information as a desired word length, the image conversion unit generates the reconstruction image that allows visual recognition of the object by using the pixel output information that are set by the information compression unit as the desired word length, and the word length reconstruction unit reconstructs the reconstruction image generated by the image conversion unit to an image having the word length before the compression.

Furthermore, in the image capturing element, at least two of the plurality of pixel output units are different from each other in the incident angle directivity indicating directivity with respect to the incident angle of incident light from the object. For example, each of the plurality of pixel output units includes one photodiode, each of the at least two pixel output units includes a light-shielding film that shields incidence of the object light on the photodiode, and a range in which the object light is shielded by the light-shielding film is different from each other between the at least two pixel output units. Furthermore, each of the at least two pixel output units may include a plurality of photodiodes, and the plurality of photodiodes may differ from each other in degree of contribution to the output pixel value. Furthermore, each of the plurality of pixel output units may have a configuration that allows incident directivity with respect to the object light to be set independently.

A second aspect of this technology is an information processing method including:

performing compression processing to reduce an amount of data of pixel output information including a plurality of pixel outputs that is output from an image capturing element including the plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light.

A third aspect of this technology is an information processing device including:

an image conversion unit configured to generate a reconstruction image by using compressed information of pixel output information including a plurality of pixel outputs that is output from an image capturing element including the plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light.

A fourth aspect of this technology is an image capturing device including:

an image capturing unit including an image capturing element including the plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light; and an information compression unit configured to perform compression processing to reduce an amount of data of pixel output information including the plurality of pixel outputs that is output from the image capturing unit.

A fifth aspect of this technology is a program for causing a computer to execute image processing and causing the computer to execute a step of reducing an amount of data of pixel output information including a plurality of pixel outputs that is output from an image capturing element including the plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light.

Effects of the Invention

According to this technology, an information compression unit performs compression processing to reduce an amount of data of pixel output information including a plurality of pixel outputs that is output from an image capturing element including a plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light. Therefore, since an amount of data in a case where an image capturing element of image capturing lens free and the like is used can be reduced, it is possible to reduce the load on storage or transmission when a long time capturing is performed or a large number of images are captured. Note that effects described in the present specification are merely illustrative and not restrictive, and additional effects may be produced.

BRIEF DESCRIPTION OF DRAWINGS

FIG. 5 is a diagram showing a configuration example of an image capturing unit 121.

FIG. 6 is a diagram showing a second configuration example of the image capturing unit 121.

FIG. 7 is a diagram for describing incident angle directivity.

FIG. 9 is a diagram showing a case where a black and white pattern mask is used.

MODE FOR CARRYING OUT THE INVENTION

Figure 1:
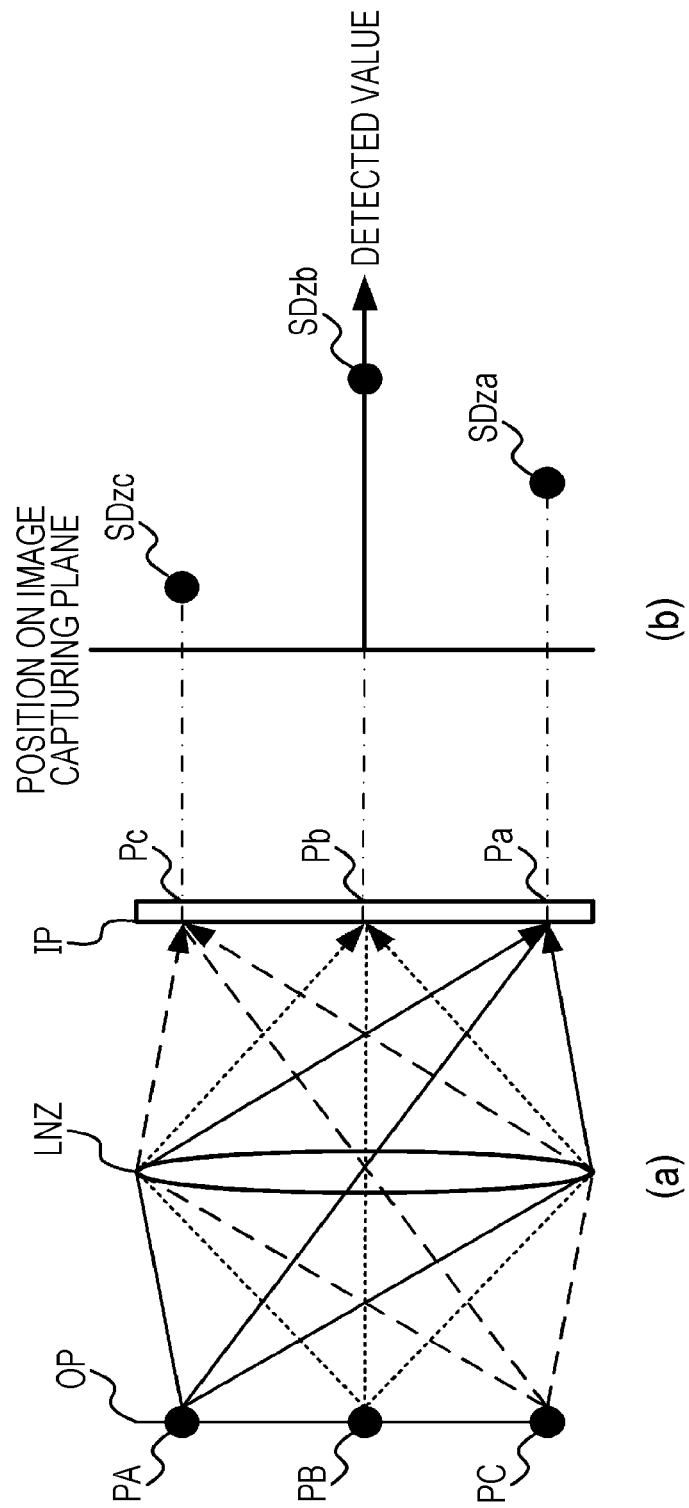
FIG. 1 is a diagram for describing the principle of image capturing in a case where an image capturing lens is used.

A mode for carrying out the present technology will be described below. Note that the description will be made in the following order.

1. Overview of image capturing
2. Configuration of image capturing unit
3. Another configuration of image capturing unit
4. Relationship between light source and pixel output information
5. Configuration and operation of information processing system
6. Configuration and operation of first embodiment of information compression unit
  6-1. First operation in first embodiment
  6-2. Second operation in first embodiment
  6-3. Third and fourth operations in first embodiment
7. Configuration and operation of second embodiment of information compression unit
8. Configuration and operation of third embodiment of information compression unit
9. Another operation of information compression unit
10. Another configuration and operation of information processing system
11. Configuration and operation of image capturing device using information processing system <1. Overview of Image Capturing>

Every object can be considered as a set of point light sources, and light is emitted in all directions. Therefore, the principle of image capturing can be described by considering how to capture light emitted from the point light sources.

FIG. 1 is a diagram for describing the principle of image capturing in a case where an image capturing lens is used. As shown in (a) of FIG. 1, objects on an object plane OP are, for example, point light sources PA, PB, and PC. A light beam emitted from the point light source PA is collected at a position Pa on an image capturing plane IP by an image capturing lens LNZ. Note that the image capturing lens LNZ is a lens having a light collecting function for causing object light incident from the same direction to enter both pixels adjacent to each other. Similarly, a light beam emitted from the point light source PB (PC) is collected at a position Pb (Pc) on the image capturing plane IP by the image capturing lens LNZ. In an element at the position Pa, a pixel output according to intensity of the light beam from the point light source PA is obtained. Similarly, in an element at the position Pb (Pc), a pixel output according to intensity of the light beam from the point light source PB (PC) is obtained. Therefore, an image signal of a captured image indicating the point light sources PA, PB, and PC on the object plane OP can be generated using the pixel output of each pixel. Note that in (b) of FIG. 1, the vertical axis represents the position on the image capturing plane IP, and the horizontal axis is a detected value based on light intensity in an image capturing element at each position. For example, (b) of FIG. 1 illustrates a case where the detected value is SDza at the position Pa, the detected value is SDzb at the position Pb, the detected value is SDzc at the position Pc, and "SDzb>SDza>SDzc."

Figure 2:
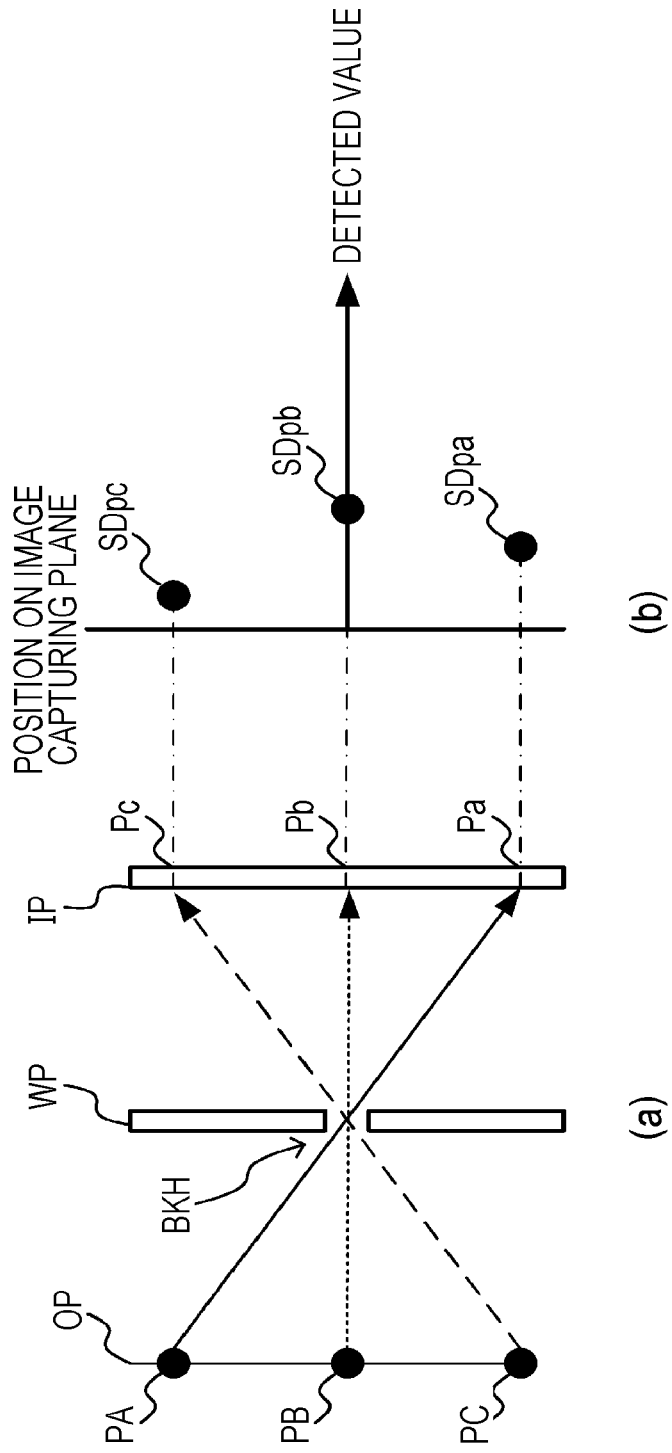
FIG. 2 is a diagram for describing the principle of image capturing in a case where a pinhole is used.

FIG. 2 is a diagram for describing the principle of image capturing in a case where a pinhole is used. With the pinhole, the relationship between the position of each pixel and an incident angle of light is uniquely determined. As shown in (a) of FIG. 2, the objects on the object plane OP are, for example, the point light sources PA, PB, and PC. A light beam emitted from the point light source PA penetrates a hole BKH of a light shielding wall WP, and the position Pa on the image capturing plane IP is irradiated with the light beam. Similarly, a light beam emitted from the point light source PB (PC) penetrates the hole BKH of the light shielding wall WP, and the position Pb (Pc) on the image capturing plane IP is irradiated with the light beam. In the element at the position Pa, a pixel output according to intensity of the light beam from the point light source PA that penetrates the hole BKH is obtained. Similarly, in the element at the position Pb (Pc), a pixel output according to intensity of the light beam from the point light source PB (PC) that penetrates the hole BKH is obtained. Therefore, an image signal of a captured image indicating the point light sources PA. PB, and PC on the object plane OP can be generated using the pixel output of each pixel. Note that in (b) of FIG. 2, the vertical axis represents the position on the image capturing plane IP, and the horizontal axis is a detected value based on light intensity in the image capturing element at each position. For example, (b) of FIG. 2 illustrates a case where the detected value is SDpa at the position Pa, the detected value is SDpb at the position Pb, the detected value is SDpc at the position Pc, and "SDpb>SDpa>SDpc." Furthermore, since the pixel output is generated only by the hole BKH and the penetrated light beam, the detected value is smaller than in a case where the image capturing lens is used. That is, "SDza>SDpa, SDzb>SDpb, SDzc>SDpc." Note that in a case where the configuration uses the pinhole, the relationship between the position of each pixel in the image capturing element and the incident angle of the incident object light is uniquely determined. Therefore, in a case where the configuration uses the pinhole and the conventional image capturing element or the method of other companies shown in the citation list is used, incident angle directivity cannot be set independently for each pixel output unit. Moreover, since the image capturing device having the configuration using the pinhole and the image capturing element does not need to be provided with the image capturing lens, there is a possibility that the device configuration can be made smaller than the image capturing device having the configuration using the image capturing lens and the image capturing element. However, since luminous intensity of the captured image is not sufficient, it is required to increase time of exposure to light, increase the gain, and the like such that an image with a certain level of luminous intensity can be captured. There is a possibility that in image capturing of a high-speed object, blurring is likely to occur, or natural color expression may not be obtained.

Figure 3:
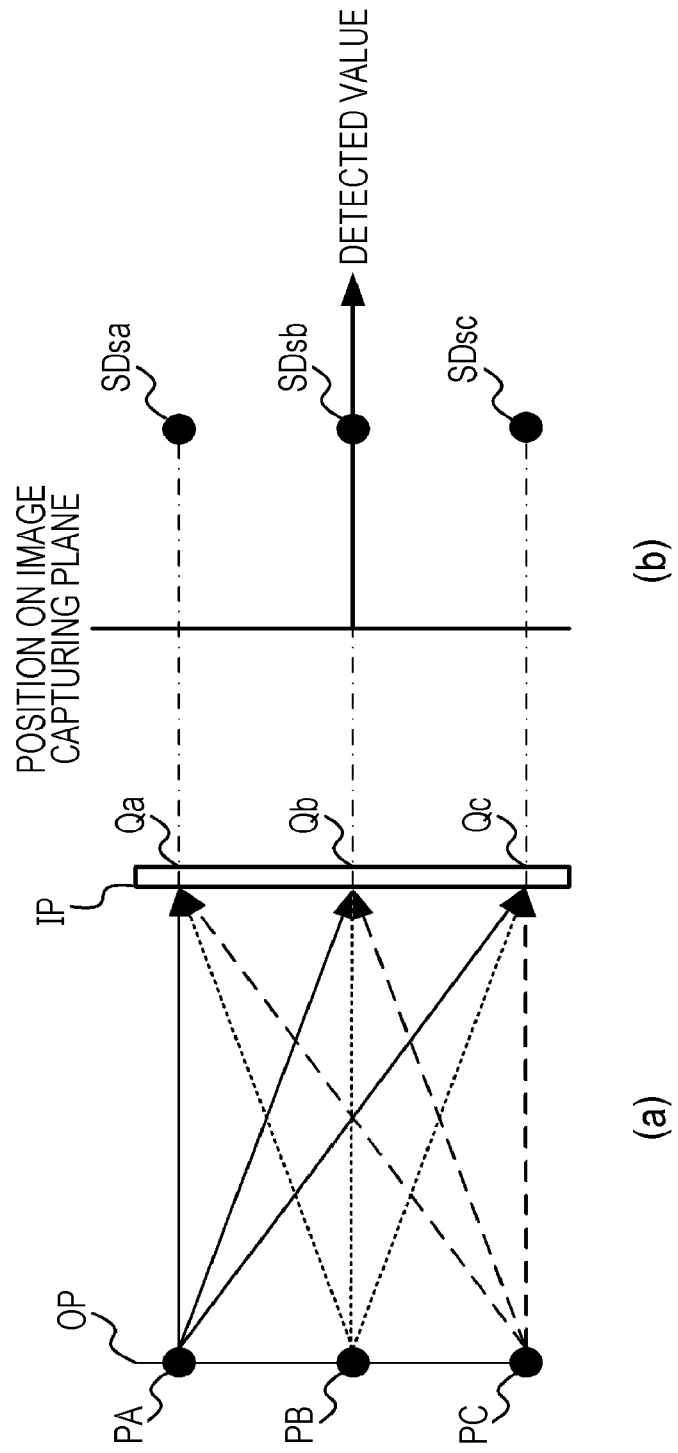
FIG. 3 is a diagram for describing a case where no image capturing lens or pinhole is provided.

FIG. 3 is a diagram for describing a case where a normal image capturing element is used with a lens-less configuration including no image capturing lens or pinhole. As shown in (a) of FIG. 3, the light beam emitted from each of the point light sources PA, PB, and PC enters positions Qa, Qb, and Qc. Furthermore, in (b) of FIG. 3, the vertical axis represents the position in the image capturing plane IP, and the horizontal axis is a detected value based on light intensity in the pixel at each position. The pixel output of the element at each of the positions Qa, Qb, and Qc is a pixel output according to the intensity of the light beams from the point light sources PA, PB, and PC. For example, (b) of FIG. 3 shows the detected value SDsa at the position Qa, the detected value SDsb at the position Qb, the detected value SDsc at the position Qc, and "SDsa SDsb SDsc." Therefore, the image signal of the captured image indicating the point light sources PA, PB, and PC on the object plane OP cannot be generated using the pixel output of each pixel.

Therefore, the image capturing unit of the present technology has a configuration using an image capturing element including a plurality of pixel output units that receives object light that enters without passing through any of an image capturing lens and a pinhole, and among the plurality of pixel output units, the pixel outputs of at least two of the pixel output units have incident angle directivity modulated into different incident angle directivity according to an incident angle of the object light. The characteristic in which the incident angle directivity with respect to the object light differs mentioned here means that the light receiving sensitivity characteristic according to the incident angle of the incident light with respect to the pixel output unit differs. Note that what kind of unit the pixel output unit is will be clarified in the following description.

<2. Configuration of Image Capturing Unit>

Next, the image capturing unit that generates the pixel output information to be processed by the information processing device of the present technology will be described. The image capturing unit has a configuration using an image capturing element including a plurality of pixel output units that receives object light that enters without passing through any of an image capturing lens and a pinhole, and among the plurality of pixel output units, output pixels of at least two of the pixel output units have incident angle directivity modulated into different incident angle directivity according to an incident angle of the object light. The image capturing element acquires the pixel outputs of one image including the pixel outputs at the positions of respective pixel output units. In other words, the image capturing unit generates the pixel output for each pixel output unit for the object light that enters without passing through the light-collecting function for causing the object light incident from the same direction to enter both pixel output units adjacent to each other, and the incident angle directivity of the output pixel values (pixel outputs) of at least two pixel output units of the plurality of pixel output units is different. That is, the image capturing unit generates the pixel output for each pixel output unit by the image capturing element of image capturing lens free. Hereinafter, a case where the image capturing unit generates the pixel output information according to the object light will be described.

Figure 4:
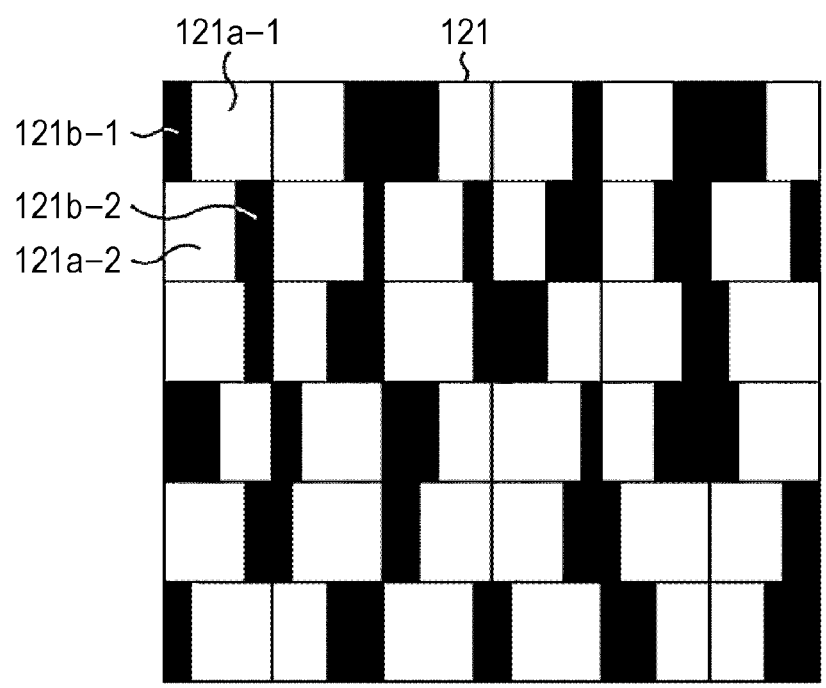
FIG. 4 is a diagram illustrating a configuration of an image capturing unit.

FIG. 4 is a diagram illustrating the configuration of the image capturing unit that generates the pixel output information to be processed by the information processing device of the present technology. Note that FIG. 4 shows a partial region of the image capturing unit, for example, a region in which the number of pixels in the horizontal direction and the vertical direction is 6 pixels×6 pixels, respectively.

For each pixel (pixel output unit) 12a of the image capturing element, in the image capturing unit 121, a light-shielding film 121b, which is a modulation element and a part of a light receiving region of the photodiode, is provided for each pixel 12a as a different range, and incident light that enters each pixel 12a is optically modulated according to the incident angle. That is, the image capturing unit 121 has a configuration that makes it possible to have different light-receiving sensitivity according to the incident angle of incident light for each pixel (pixel output unit), and has directivity with respect to the incident direction, that is, incident angle directivity. Therefore, by providing the light-shielding film 12b in a different range in each pixel 121a, each pixel 12a has a different light-receiving sensitivity to the incident angle of the incident light, and each pixel 12a has different incident angle directivity.

For example, the light-shielding film 121b-1 and the light-shielding film 121b-2 provided in the pixel 121a-1 and the pixel 121a-2 respectively have different ranges where light is shielded in the pixels (at least one of the region (position) to shield light and the area to shield light is different). That is, in the pixel 121a-1, the light-shielding film 121b-1 is provided to shield a part of the left side of the light receiving region of the photodiode by a predetermined width. In the pixel 121a-2, the light-shielding film 121b-2 is provided to shield a part of the right side of the light receiving region by a width wider in the horizontal direction than the light-shielding film 121b-1. Furthermore, in the other pixels 121a, similarly, the light-shielding films 121b are provided to shield different ranges in the light receiving region of each pixel, and are randomly arranged in a pixel array. Since the image capturing element has a configuration that allows the width and position of the light shielding film to be set (designed) independently for each pixel 121a, the image capturing element has a configuration that allows the incident angle directivity to be set independently for each pixel 121a. As the output pixel value, the image capturing element has a configuration that allows the incident angle directivity to be set independently for each pixel 121a.

Note that the range of the light-shielding film 121b is preferably an area with which a predetermined amount of light can be secured because as the proportion of covering the light receiving region of each pixel increases, the amount of light that can be received decreases. Furthermore, it is not necessary to provide the light shielding film in all the pixels 121a of the image capturing element.

Next, the configuration of the image capturing unit will be described. FIG. 5 is a diagram showing a configuration example of the image capturing unit 121. (a) of FIG. 5 is a side cross-sectional view of the image capturing unit 121. (b) of FIG. 5 is a top view of the configuration example of the image capturing unit 121. Note that the side cross-sectional view of (a) of FIG. 5 is an A-B cross section of (b) of FIG. 5.

In the image capturing unit 121, incident light L enters downward from an upper portion of the diagram. The adjacent pixels 121a-15 and 121a-16 each have a so-called back-illuminated configuration in which a wiring layer Z12 is provided in the lowest layer in the diagram, and a photoelectric conversion layer Z11 is provided thereon.

Note that in a case where it is not necessary to distinguish the pixels 121a-15 and 121a-16, the pixels 121a-15 and 121a-16 are simply referred to as the pixel 121a, and the other configurations are similarly referred to. Furthermore, FIG. 5 is a side view and a top view of two pixels constituting the pixel array of the image capturing unit 121. Needless to say, a larger number of pixels 12a are arranged, but are omitted in the diagram.

Moreover, the pixels 121a-15 and 121a-16 include photodiodes 121e-15 and 121e-16 in the photoelectric conversion layer Z11, respectively. Furthermore, on-chip lenses 121c-15 and 121c-16, and color filters 121d-15 and 121d-16 are respectively formed from above on the photodiodes 121e-15 and 121e-16.

Each on-chip lens is a lens provided in each pixel output unit and having a function of collecting object light that enters the on-chip lens only onto the corresponding pixel output unit. For example, the on-chip lenses 121c-15 and 121c-16 collect the incident light onto the photodiodes 121e-15 and 121e-16, respectively.

The color filters 121d-15 and 121d-16 are filters that transmit light having either specific wavelength such as red, green, blue, and infrared, for example. Furthermore, the color filters 121d-15 and 121d-16 may be transparent, and a configuration that does not use any color filter may be employed.

Light-shielding films 121b-15 and 121b-16 and an element separation film 121s are formed at a boundary between the pixels in the photoelectric conversion layer Z11 of the pixels 121a-15 and 121a-16. As shown in (a) of FIG. 5, the light-shielding films 121b-15 and 121b-16 each have an L-shaped configuration in side view, and include incident light-shielding portions 121b-15a and 121b-16a provided on the filter surface side, and separation portions 121b-15b and 121b-16b formed perpendicularly to the filter surface. Furthermore, as shown in (b) of FIG. 5, the incident light-shielding portions of the light-shielding films 121b-15 and 121b-16 shield a light-receiving plane S viewed from the upper surface. On the light-receiving plane S of the photodiodes 121e-15 and 121e-16 in the pixels 121a-15 and 121a-16, different ranges are shielded by the incident light-shielding portions 121b-15a and 121b-16a of the light-shielding films 121b-15 and 121b-16, whereby different incident angle directivity is set for each pixel (pixel output unit). However, the range in which light is shielded is not necessarily different in each of all the pixels 12a of the image capturing unit 121. There may be some pixels 12a in which the same region is shielded from light.

Furthermore, the element separation film 121s is provided to face the separation portions 121b-15b and 121b-16b of the light-shielding films 121b-15 and 121b-16. Crosstalk between adjacent pixels is suppressed by the separation portions of the light-shielding films 121b-15 and 121b-16 and the element separation film 121s, for example, for incident light L in (a) of FIG. 5.

The light-shielding films 121b-15 and 121b-16 and the element separation film 121s includes a metal, for example, tungsten (W), aluminum (Al), or an alloy of aluminum (Al) and copper (Cu). Furthermore, the light-shielding films 121b-15 and 121b-16 and the element separation film 121s may be formed simultaneously with the same metal as the wiring by the same process as the wiring forming process in a semiconductor process. Moreover, film thicknesses of the light-shielding films 121b-15 and 121b-16 and the element separation film 121s do not have to be the same thickness depending on the position. Note that in the examples of FIGS. 4 and 5, one pixel corresponds to one pixel output unit.

FIG. 6 is a diagram showing a second configuration example of the image capturing unit 121. (a) of FIG. 6 shows a side cross-sectional view of the pixel 12a of the image capturing unit 121 that is the second configuration example. FIG. 6(b) shows a top view of the image capturing unit 121. Furthermore, the side cross-sectional view shown in (a) of FIG. 6 is an A-B cross section in (b) of FIG. 6.

As shown in FIG. 6, the image capturing unit 121 has a configuration different from the configuration of the image capturing unit 121 of FIG. 5 in that four photodiodes 121f-1 to 121f-4 are formed in the pixel 121a, and the element separation film 121s is formed in a region separating the photodiodes 121f-1 to 121f-4. That is, in the image capturing unit 121 of FIG. 6, the element separation film 121s is formed in a "+" shape when viewed from above. The intersection position of the "+" shape may be set at the center position of the pixel 12a as shown in FIG. 6 such that the light-receiving surfaces of the four photodiodes have the same size. By moving the intersection position from the center position of the pixel 121a, the pixel 12a may have a configuration including photodiodes having different light-receiving surface sizes, that is, a configuration including pixel output units with different characteristics depending on whether the intersection position is moved or not. Note that common components are denoted with the same reference symbol, and detailed description thereof will be omitted.

In the image capturing unit 121 configured as in FIG. 6, the photodiodes 121f-1 to 121f-4 are separated by the element separation film 121s, thereby preventing electrical and optical crosstalk between the photodiodes 121f-1 to 121f-4.

That is, the image capturing unit of FIG. 5 has a configuration in which the incident angle directivity of each pixel differs by providing one pixel output unit with one photodiode and making the light-shielding state of each pixel (pixel output unit) by the light-shielding film 12b different for each pixel. Note that in the image capturing unit of FIG. 5, one pixel corresponds to the pixel output unit. Furthermore, in the image capturing unit of FIG. 6, four photodiodes are provided in one pixel output unit, and the photodiode that contributes to the output pixel unit among the four photodiodes is different for each pixel output unit, whereby each pixel output unit can be provided (set) with different incident angle directivity independently. For example, if output pixel information is generated by adding signals obtained by the photodiode 121f-1 and the photodiode 121f-2, the output pixel information has horizontal incident angle directivity. If output pixel information is generated by adding signals obtained by the photodiodes 121f-1 and 121f-3, the output pixel information has vertical incident angle directivity.

Note that the presence of contribution can be implemented by whether or not to read the detected value of each photodiode to floating diffusion, by resetting the detected value (charge) stored in the photodiode before reading to floating diffusion using an electronic shutter function, and the like. Furthermore, in a case where the electronic shutter function is used, if the detected value is reset immediately before reading the charge generated by the photodiode 121f to floating diffusion, the photodiode 121f can be set in a state where there is no contribution to the output pixel unit, and if there is a time between reset and reading to floating diffusion, it is possible to make a partial contribution. Note that in the image capturing unit of FIG. 6, since one output pixel value is obtained from four photodiodes, four photodiodes constitute one pixel output unit.

Next, incident angle directivity will be described. FIG. 7 is a diagram for describing incident angle directivity of the pixel output unit in the image capturing unit 121. In (a) and (b) of FIG. 7, an on-chip lens 121c-11 (121c-12) that collects incident light from the upper incident direction, a color filter 121d-11 (121d-12) that transmits light of a predetermined wavelength, and a photodiode 121e-11 (121e-12) that generates a pixel signal by photoelectric conversion are stacked in this order.

Note that in a case where it is not necessary to distinguish each of the on-chip lenses 121c-11 and 121c-12, the color filters 121d-11 and 121d-12, and the photodiodes 121e-11 and 121e-12, these parts are simply referred to as an on-chip lens 121c, a color filter 121d, and a photodiode 121e.

In the image capturing unit 121, there is provided a light-shielding film 121b-11 (121b-12) including, for example, metal wiring and the like and shields a part of the region that receives incident light.

As shown in (a) of FIG. 7, in a case where the light-shielding film 121b-11 that shields the right half of the photodiode 121e-11 is provided, as shown by the solid waveform in (c) of FIG. 7, the detected value of the photodiode 121e-11 changes according to the incident angle θ of the incident light. Note that in (c) of FIG. 7, the horizontal axis indicates the incident angle θ, and the vertical axis indicates the detected value of the photodiode 121e.

That is, the detected value of the photodiode 121e-11 increases as the incident angle θ increases (as the incident direction shifts toward the right side in the diagram) because light enters a range where the light-shielding film 121b-11 is not provided. Conversely, the detected value of the photodiode 121e-11 decreases as the incident angle θ decreases (as the incident direction shifts toward the left side in the diagram) because light enters a range where the light-shielding film 121b-11 is provided.

Furthermore, as shown in (b) of FIG. 7, in a case where the light-shielding film 121b-12 that shields the left half of the photodiode 121e-12 is provided, as shown by the dotted line waveform in (c) of FIG. 7, the detected value of the photodiode 121e-12 changes according to the incident angle θ of the incident light.

That is, the detected value of the photodiode 121e-12 decreases as the incident angle θ increases (as the incident direction shifts toward the right side in the diagram) because light enters a range where the light-shielding film 121b-12 is provided. Conversely, the detected value of the photodiode 121e-12 increases as the incident angle θ decreases (as the incident direction shifts toward the left side in the diagram) because light enters a range where the light-shielding film 121b-12 is not provided.

The waveforms shown by the solid and dotted lines indicating the change in the detected value according to the incident angle θ shown in (c) of FIG. 7 can be changed according to the range of the light-shielding films 121b-11 and 121b-12, thereby making it possible to have incident angle directivity different from each other between the pixel output units. The incident angle directivity mentioned here is the characteristic of change in the detected value of each pixel output unit according to the incident angle θ. It can be said that this is a characteristic of the change in the light shielding level according to the incident angle θ. That is, the light-shielding films 121b-11 and 121b-12 shield incident light of a specified direction at a high level, but cannot sufficiently shield incident light from directions other than the specified direction. That is, the incident light is optically modulated according to the incident angle, and the change in the level at which light can be shielded causes a change in the detected value according to the incident angle θ as shown in (a) of FIG. 7. Therefore, it is possible to provide each pixel output unit with different incident angle directivity.

Furthermore, similarly in a case where four photodiodes are provided in one on-chip lens 121c as in the second configuration example of the image capturing unit, by making the photodiode that contributes to the pixel output among the four photodiodes different for each pixel output unit, it is possible to provide each pixel output unit with different incident angle directivity.

Note that a case where the image capturing unit 121 described above is provided with the on-chip lens have been illustrated, but even with the above-described configuration that does not use the on-chip lens, it is possible to provide each pixel output unit with different incident angle directivity.

<3. Another Configuration of Image Capturing Unit>

In that connection, the configuration of the image capturing unit is not limited to the configuration that provides each pixel output unit with different incident angle directivity by using the light-shielding film that can be set independently for each pixel output unit, changing the number of contributing photodiodes, or changing the intersection position of a plurality of photodiodes. For example, the image capturing unit may use a random black and white pattern mask or an optical interference mask as an element for causing the incident angle directivity to have characteristics different from each other.

Figure 8:
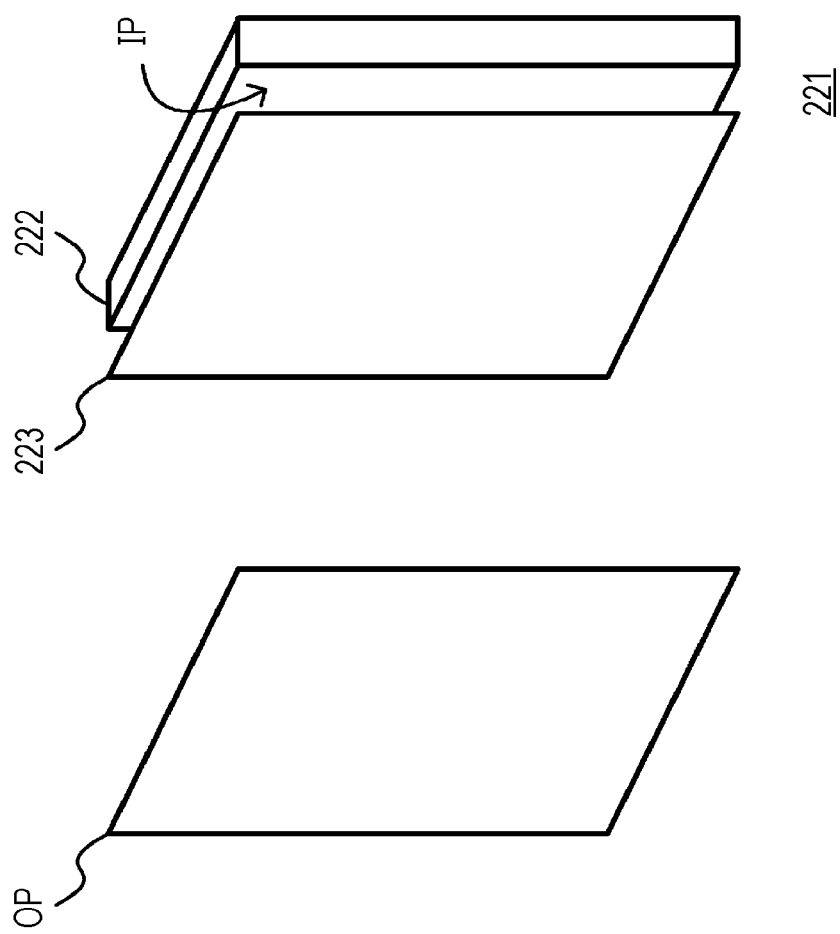
FIG. 8 is a diagram showing another configuration of the image capturing unit.

FIG. 8 is a diagram showing another configuration of the image capturing unit. The image capturing unit 221 has a configuration in which a mask 223 that is a modulation element is fixed to an image capturing element 222 to have a predetermined space with respect to the image capturing plane IP of the image capturing element 222, and light from the object plane OP enters the image capturing plane IP of the image capturing element 222 via the mask 223.

FIG. 9 is a diagram showing a case where a black and white pattern mask is used. (a) of FIG. 9 illustrates the black and white pattern mask. The black and white pattern mask 223BW has a configuration in which white pattern parts that transmit light and black pattern parts that shields light are randomly arranged. The pattern size is set independently of the pixel size of the image capturing element 222. (b) of FIG. 9 schematically shows an irradiation state of the image capturing plane IP with the light emitted from the point light source PA and the light emitted from the point light source PB. Furthermore, (c) of FIG. 9 schematically and individually shows a response of the image capturing element to the light emitted from the point light source PA and the light emitted from the point light source PB in a case where the black and white pattern mask 223BW is used. The light from the object plane OP enters the image capturing plane IP of the image capturing element 222 via the black and white pattern mask 223BW. Therefore, the response of the image capturing element to the light emitted from the point light source PA of the object plane OP is Sbwa. Furthermore, the response of the image capturing element to the light emitted from the point light source PB of the object plane OP is Sbwb. Therefore, the pixel output information output from the image capturing element 222 is information of one image obtained by combining the response of each point light source for each pixel output unit. With this configuration, the incident angle directivity cannot be set independently for each pixel output unit, and pixel output units at close positions have incident angle directivity close to each other.

Figure 10:
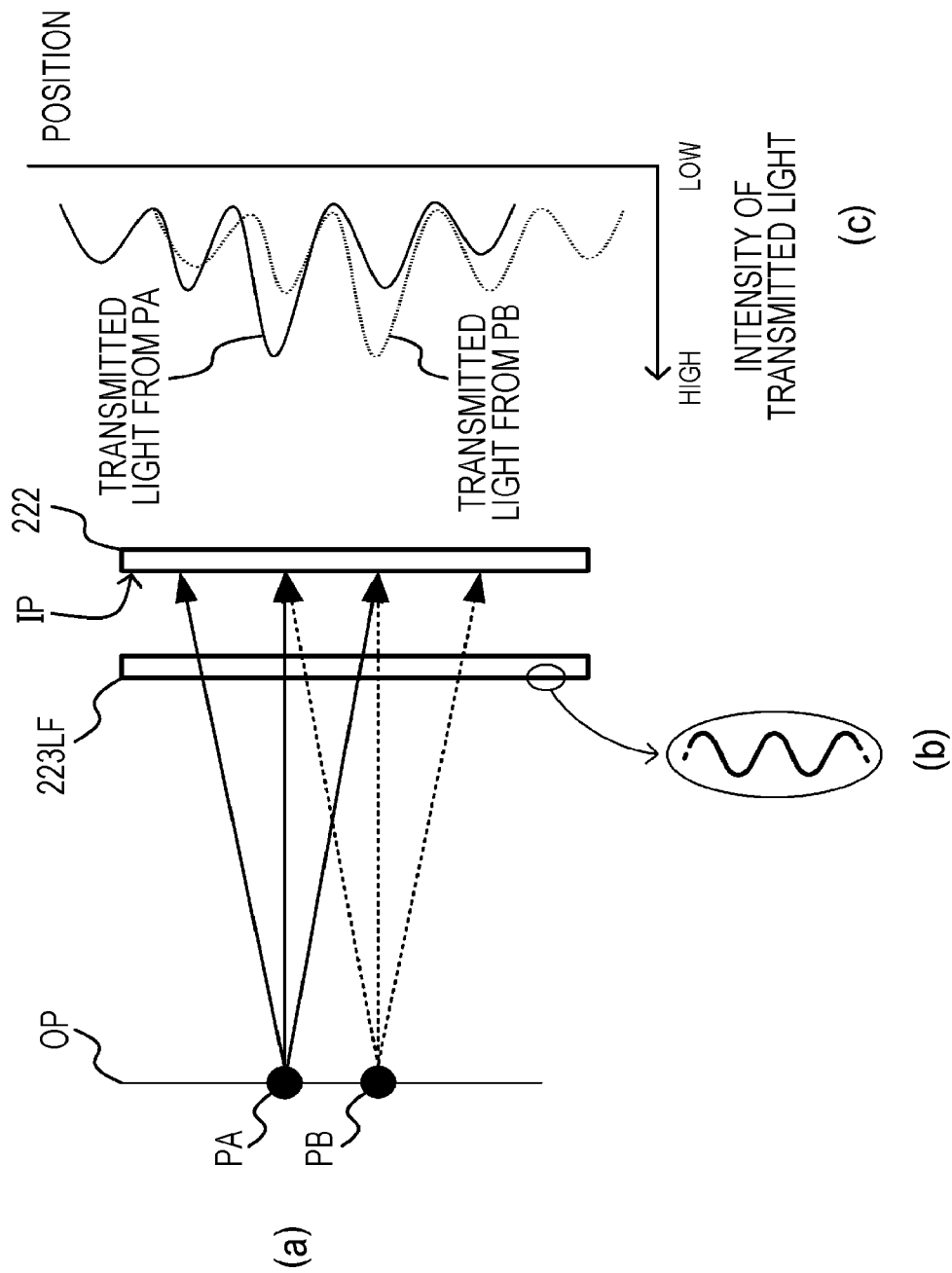
FIG. 10 is a diagram showing a case where an optical interference mask is used.

FIG. 10 is a diagram showing a case where an optical interference mask is used. As shown in (a) of FIG. 10, the image capturing plane IP of the image capturing element 222 is irradiated with the light emitted from the point light sources PA and PB of the object plane OP via the optical interference mask 223LF. For example, the light incident surface of the optical interference mask 223LF is provided with unevenness on a scale of a light wavelength as shown in (b) of FIG. 10. Furthermore, the optical interference mask 223LF has the maximum transmission of light of a specified wavelength emitted from the perpendicular direction. When the change in the incident angle (inclination with respect to the perpendicular direction) of the light of a specified wavelength emitted from the point light source PA or PB of the object plane OP with respect to the optical interference mask 223LF increases, an optical path length changes. Here, when the optical path length is an odd multiple of the half wavelength, the light weakens each other, and when the optical path length is an even multiple of the half wavelength, the light strengthens each other. That is, the transmitted light of a specified wavelength emitted from the point light source PA or PB and having penetrated the optical interference mask 223LF enters the image capturing plane IP of the image capturing element 222 with the intensity having incident angle directivity according to the incident angle with respect to the optical interference mask 223LF as shown in (c) of FIG. 10. Therefore, the pixel output information output from each output pixel unit of the image capturing element 222 is information obtained by combining the modulated light intensity of each point light source that has penetrated the optical interference mask 223LF. With this configuration, the incident angle directivity cannot be set independently for each pixel output unit, and pixel output units at close positions have incident angle directivity close to each other.

Figure 11:
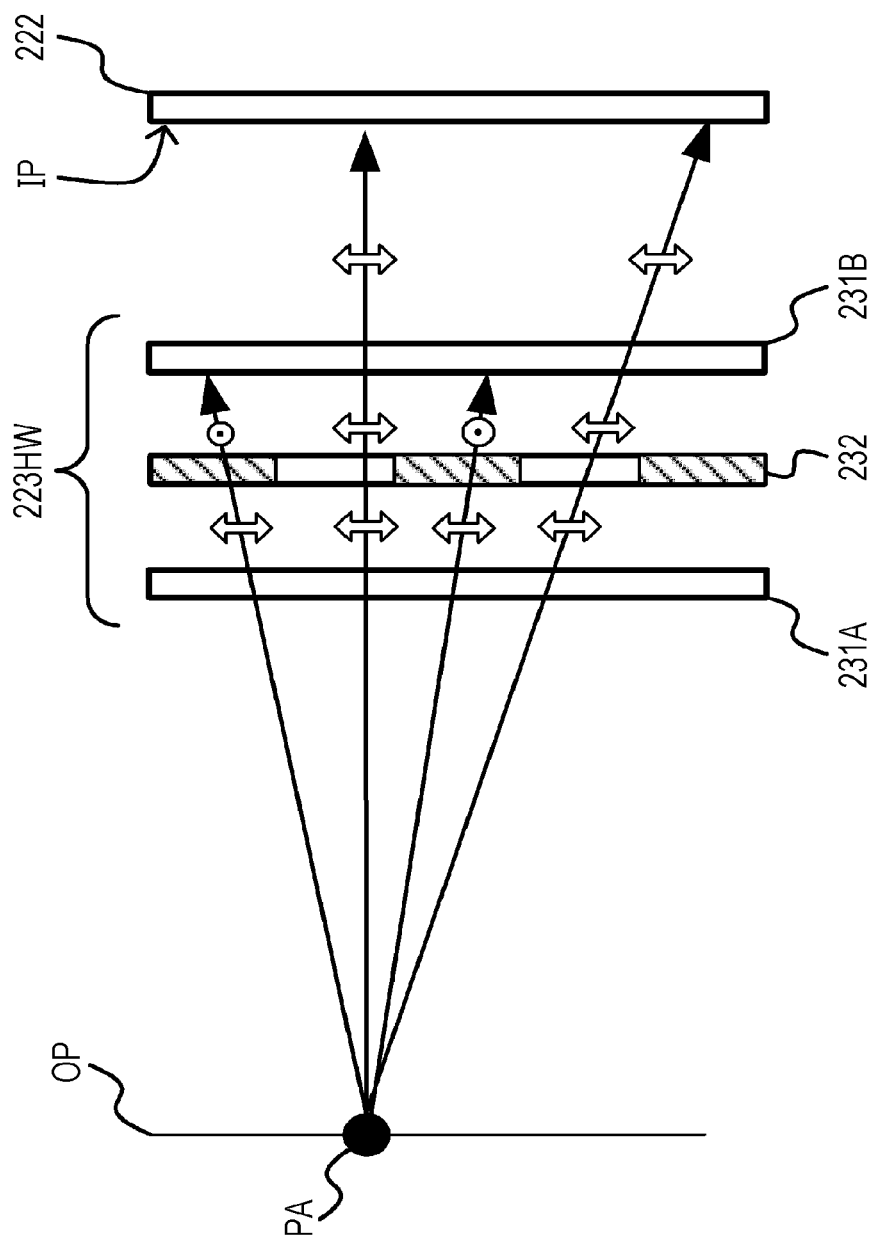
FIG. 11 is a diagram showing a modification of an image capturing element.

Note that an optical filter 223HW of FIG. 11 may be used instead of the optical filter 223BW. The optical filter 223HW includes a linear polarizing element 231A and a linear polarizing element 231B having the same polarization direction, and a λ/2 wave plate 232. The λ/2 wave plate 232 is sandwiched between the linear polarizing element 231A and the linear polarizing element 231B. In the λ/2 wave plate 232, instead of the black pattern part of the optical filter 223BW, a polarizing part shown by oblique lines is provided, and the white pattern parts and the polarizing parts are randomly arranged.

The linear polarizing element 231A transmits only light of a predetermined polarization direction out of substantially non-polarized light emitted from the point light source PA. Hereinafter, it is assumed that the linear polarizing element 231A transmits only light having the polarization direction parallel to the drawing. Out of the polarized light that has penetrated the linear polarizing element 231A, the polarization direction of the polarized light that has penetrated the polarizing part of the λ/2 wave plate 232 changes to the direction perpendicular to the drawing by rotation of the polarization plane. Meanwhile, out of the polarized light that has penetrated the linear polarizing element 231A, the polarization direction of the polarized light that has penetrated the white pattern part of the λ/2 wave plate 232 does not change from the direction parallel to the drawing. Then, the linear polarizing element 231B transmits the polarized light having penetrated the white pattern part, and hardly transmits the polarized light having penetrated the polarizing part. Therefore, the polarized light having penetrated the polarizing part has a smaller light amount than the polarized light having penetrated the white pattern part. Therefore, a light and shade pattern almost similar to the case where the optical filter 223BW is used can be generated on the light-receiving plane (image capturing plane) IP of the image capturing element 222.

<4. Relationship Between Light Source and Pixel Output Information>

Assuming that the light sources that constitute the object plane are point light sources, in the image capturing unit, a light beam emitted from the same point light source enters the image capturing plane IP via elements for causing the incident angle directivity to have characteristics different from each other, and light of incident angle directivity different from each other (for example, light with light intensity according to the difference in the incident angle or mask) enters each pixel output unit of the image capturing plane IP. That is, even the light beam having the same light intensity is detected with different sensitivity by each pixel output unit, and is detected as different detected values by each pixel output unit. Here, in a case where the difference in the incident angle directivity is expressed by a coefficient, the detected value according to the incident light in each pixel output unit can be obtained by multiplying the light intensity of the incident light by the coefficient according to the incident angle directivity.

Figure 12:
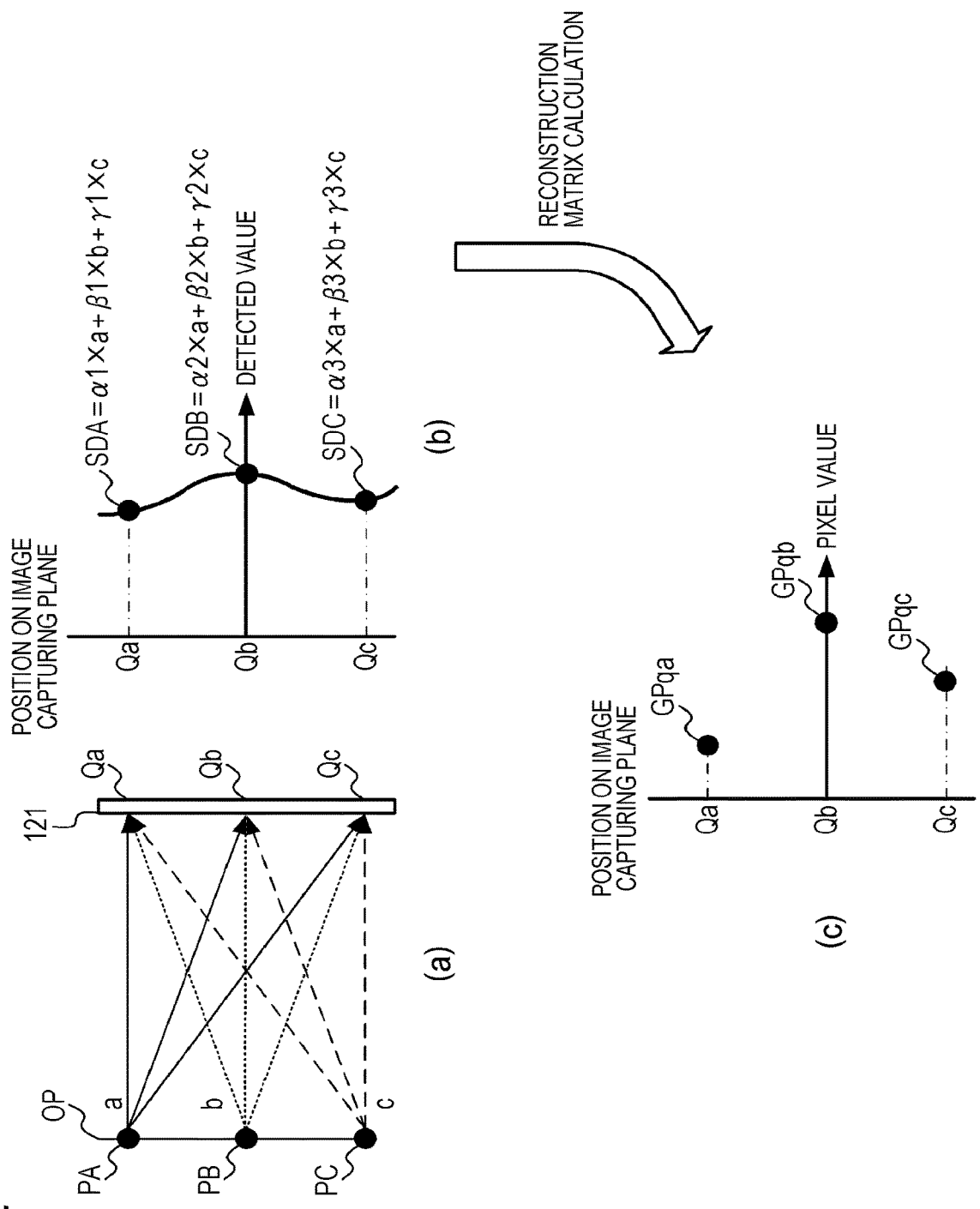
FIG. 12 is a diagram for describing computation of a detected value and a pixel value according to incident light in each pixel output unit.

FIG. 12 is a diagram for describing computation of the detected value and the pixel value according to the incident light in each pixel output unit. For example, as shown in (a) of FIG. 12, the image capturing unit 121 captures the point light sources PA, PB, and PC on the object plane OP. (b) of FIG. 12 illustrates the relationship between the positions on the image capturing plane and the detected values. Here, the detected values SDA, SDB, and SDC at the positions Qa, Qb, and Qc are expressed by the following equations (1) to (3), respectively.

$$SDA = \alpha 1 \times a + \beta 1 \times b + \gamma 1 \times c \qquad (1)$$

$$SDB = \alpha 2 \times a + \beta 2 \times b + \gamma 2 \times c \qquad (2)$$

$$SDC = \alpha 3 \times a + \beta 3 \times b + \gamma 3 \times c \qquad (3)$$

Here, α1 represents the incident angle directivity according to the incident angle of the light beam from the point light source PA at the position Qa of the image capturing plane IP, and is a coefficient corresponding to the light intensity a.

Similarly, β1 represents the incident angle directivity according to the incident angle of the light beam from the point light source PB of the object plane OP to reconstruct at the position Qa of the image capturing plane IP, and is a coefficient corresponding to the light intensity b. γ1 represents the incident angle directivity according to the incident angle of the light beam from the point light source PC of the object plane OP to reconstruct at the position Qa of the image capturing plane IP, and is a coefficient corresponding to the light intensity c.

Therefore, (α1×a) of the detected value SDA indicates the detected value by the light beam from the point light source PA at the position Qa, and is obtained by multiplying the light intensity a of the light beam from the point light source PA at the position Qa by the coefficient α1 indicating the incident angle directivity according to the incident angle.

Furthermore, (β1×b) of the detected value SDA indicates the detected value by the light beam from the point light source PB at the position Qa, and is obtained by multiplying the light intensity b of the light beam from the point light source PB at the position Qa by the coefficient β1 indicating the incident angle directivity according to the incident angle.

Moreover, (γ1×c) of the detected value SDA indicates the detected value by the light beam from the point light source PC at the position Qa, and is obtained by multiplying the light intensity c of the light beam from the point light source PC at the position Qa by the coefficient γ1 indicating the incident angle directivity according to the incident angle.

Therefore, the detected value SDA is expressed as the sum of products of the light intensity a, b, and c of the light beams from the point light sources PA, PB, and PC at the position Qa and the coefficients α1, β1, and γ1. Note that a set of coefficients used for computing one detected value, for example, a set of the coefficients α1, β1, and ⊖1 is defined as a coefficient set. For the detected value SDB at the position Qb, the coefficient set "α2, β2, γ2" corresponds to the coefficient set "α1, β1, γ1" for the detected value SDA at the point light source PA, respectively. Furthermore, for the detected value SDC at the position Qc, the coefficient set "α3, β3, γ3" corresponds to the coefficient set "α1, γ1" for the detected value SDA at the point light source PA, respectively.

Furthermore, the detected values at the positions Qa, Qb, and Qc are values expressed by the sum of products of the light intensity a, b, c of the light beams emitted from the point light sources PA, PB, and PC and the coefficients, respectively. Therefore, these detected values are mixtures of the light intensity a, b, and c of the light beams emitted from the point light sources PA, PB, and PC, respectively, and thus are different from the image of the object. Furthermore, since the detected values at the positions Qa, Qb, and Qc are mixtures of the light intensity a, b, and c of the light beams emitted from the point light sources PA, PB, and PC, respectively, the difference in the detected values between respective pixel output units is smaller than in a case where the image capturing lens is used, and the signal level is relatively uniform over the entire screen.

The detected values of the pixel output units at the positions Qa, Qb, and Qc are, as described above, values expressed by the sum of products of the light intensity a, b, and c of the light beams emitted from the point light sources PA, PB, and PC, respectively, and the coefficients. Therefore, by forming simultaneous equations using the coefficients α1, β1, γ1, α2, β2, γ2, α3, β3, and γ3 and the detected values SDA, SDB, and SDC and solving the light intensity a, b, and c, in other words, by performing reconstruction calculation using the detected values and the coefficients, as shown in (c) of FIG. 12, pixel values GPqa, GPqb, and GPqc at the positions Qa, Qb, and Qc can be obtained, respectively. Furthermore, not only in a case where the image capturing unit 121 is used, but also in a case where the image capturing unit 221 is used, by performing similar processing, the reconstruction calculation using the detected values at the positions Qa, Qb, and Qc and the coefficients is performed, and the pixel values GPqa, GPqb, and GPqc at the positions Qa, Qb, and Qc can be obtained, respectively. Note that the plurality of coefficient sets "α1, β1, γ1", "α2, β2, γ2", and "α3, β3, γ3" used in the reconstruction calculation are defined as a coefficient set group.

That is, the coefficients α1, β1, γ1, α2, β2, γ2, α3, β3, γ3 are the coefficient set group for computing the light intensity of the point light sources on the object plane from the pixel outputs. By storing the coefficient set group in advance for each object distance, and performing the reconstruction calculation using the pixel outputs and the coefficient set group corresponding to the desired object distance, it is possible to acquire the captured image that is focused on the desired object distance and allows the object to be visually recognized even by using the image capturing unit 121 (221) of image capturing lens free that does not use the image capturing lens. Furthermore, since the image capturing lens, optical filter, pinhole, and the like are not essential components, it is possible to reduce the height of the image capturing device, that is, to reduce the thickness in the incident direction.

<5. Configuration and Operation of Information Processing System>

Next, the configuration of the information processing system that processes the pixel output information generated by the image capturing device of image capturing lens free will be described.

Figure 13:
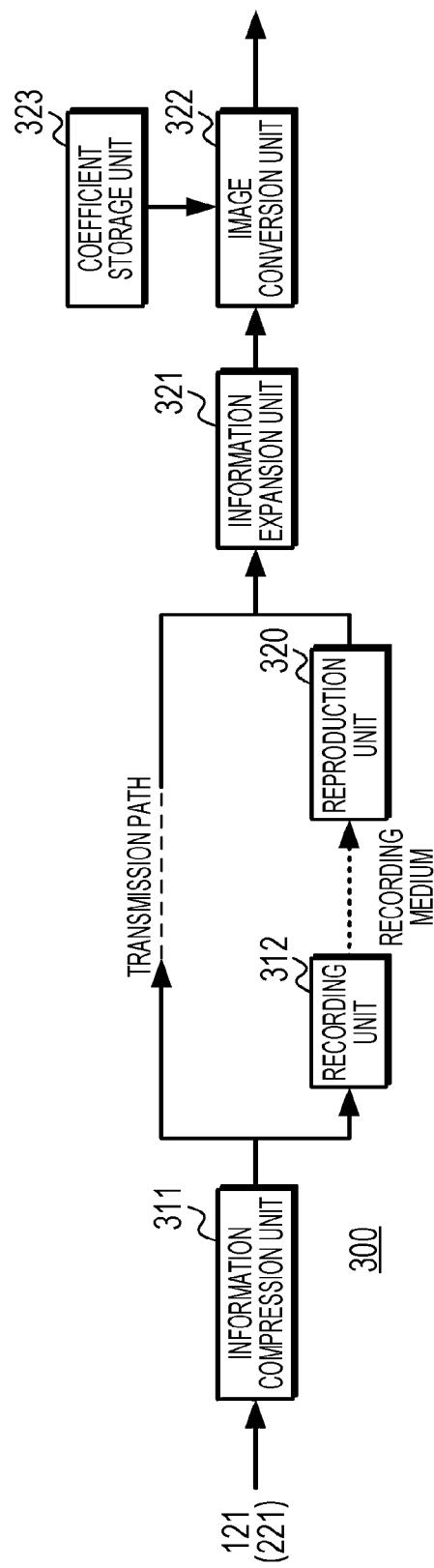
FIG. 13 is a diagram showing a configuration of an information processing system.

FIG. 13 is a diagram showing the configuration of the information processing system. The information processing system 300 includes an information compression unit 311, a recording unit 312, a reproduction unit 320, an information expansion unit 321, an image conversion unit 322, and a coefficient storage unit 323. Note that the configuration of the information processing system 300 is not limited to the configuration shown in FIG. 13. The information processing system 300 may have a configuration using only some blocks according to the operation to be performed by the information processing system 300. For example, in a case where only processing of outputting the pixel output information with a reduced amount of data from the information processing system 300 to an external device, or processing of recording in a recording medium is performed, it is not necessary to use the reproduction unit 320, the information expansion unit 321, the image conversion unit 322, or the coefficient storage unit 323. Furthermore, in a case where only reproduction processing of the pixel output information with a reduced amount of data is performed, the pixel output information being supplied from an external device or recorded in a recording medium, it is not necessary to use the information compression unit 311 or the recording unit 312.

As described above, the image capturing unit 121 (221) generates the pixel output information according to the incident angle directivity. The image capturing unit is similar to, for example, an image capturing element such as a complementary metal oxide semiconductor (CMOS) image sensor, but differs in configuration from the conventional image capturing unit using the image capturing lens in that an element for causing the incident angle directivity to have characteristics different from each other is used.

The information compression unit 311 performs amount of data compression processing on the pixel output information output from the image capturing unit 121 (221), and outputs the pixel output information after the compression processing (hereinafter referred to as "compressed information") to an external device through the recording unit 312 or a transmission path.

The recording unit 312 records the compressed information generated by the information compression unit 311 in a recording medium. Note that the recording medium may be detachable, or may be fixedly provided in a device in which the recording unit 312 and the reproduction unit 320 are integrated.

The reproduction unit 320 reads the compressed information recorded in the recording medium and outputs the compressed information to the information expansion unit 321.

The information expansion unit 321 performs expansion processing on the compressed information acquired from the reproduction unit 320 or an external device, and generates the pixel output information before the compression processing. The information expansion unit 321 generates the pixel output information before the compression processing by adding reference value information to the compressed information in the expansion processing. The information expansion unit 321 outputs the generated pixel output information to the image conversion unit 322.

The image conversion unit 322 performs reconstruction calculation using the pixel output information supplied from the information expansion unit 321 and the coefficient set group stored in the coefficient storage unit 323, and generates the pixel signal according to the image at the corresponding position in the object optical image in each pixel output unit. That is, the pixel output information generated by the image capturing unit 121 (221), which is the pixel signal according to the incident angle directivity as described above, is visually unrecognizable information with which the object cannot be visually recognized. Therefore, the image conversion unit performs reconstruction calculation using the coefficient set group stored in the coefficient storage unit 323 to generate visually recognizable information, that is, the image signal of the captured image with which the object can be visually recognized. The image conversion unit 322 outputs the generated image signal to a display unit or an external device.

The coefficient storage unit 323 stores the coefficient set group to be used for the calculation for reconstructing the image signal indicating the captured image from the pixel output information. As shown in equation (1) described above, for example, $\alpha 1$ is a coefficient indicating the incident angle directivity according to the incident angle of the light beam from the point light source PA at the position Qa. Furthermore, $\beta 1$ is a coefficient indicating the incident angle directivity according to the incident angle of the light beam from the point light source PB at the position Qa. Such a coefficient $\alpha 1$ for the point light source PA, the coefficient $\beta 1$ for the point light source PB, and coefficients for other point light sources are computed in advance according to the image capturing unit 121 (221), and the coefficient set group including the coefficient set computed for each position is stored in the coefficient storage unit 323.

<6. Configuration and Operation of First Embodiment of Information Compression Unit>

Figure 14:
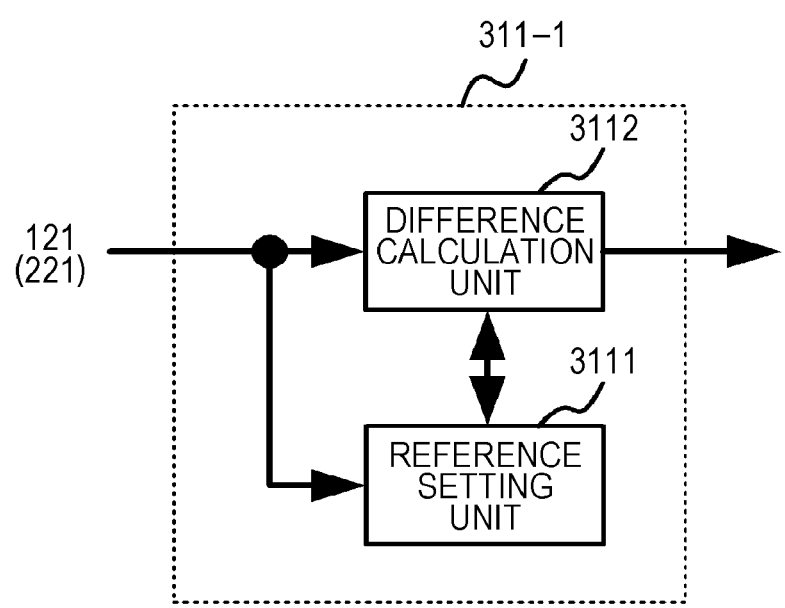
FIG. 14 is a diagram illustrating a configuration of a first embodiment of an information compression unit.

FIG. 14 is a diagram illustrating the configuration of the first embodiment of the information compression unit. As described above, in the pixel output information, the difference in the detected value of the light intensity between the pixel output units is smaller than in a case where the image capturing lens is used. Therefore, an information compression unit 311-1 performs differential compression and reduces the amount of data of the pixel output information output from the image capturing unit 121 (221) to allow reduction in the load on storage and transmission of the pixel output information. The information compression unit 311-1 includes, for example, a reference setting unit 3111 and a difference calculation unit 3112. The reference setting unit 3111 sets the reference value information. The difference calculation unit 3112 computes the difference between the reference value information set by the reference setting unit 3111 and the pixel output information of each pixel output unit, thereby generating the compressed information with the amount of data smaller than the pixel output information.

<6-1. First Operation in First Embodiment>

Figure 15:
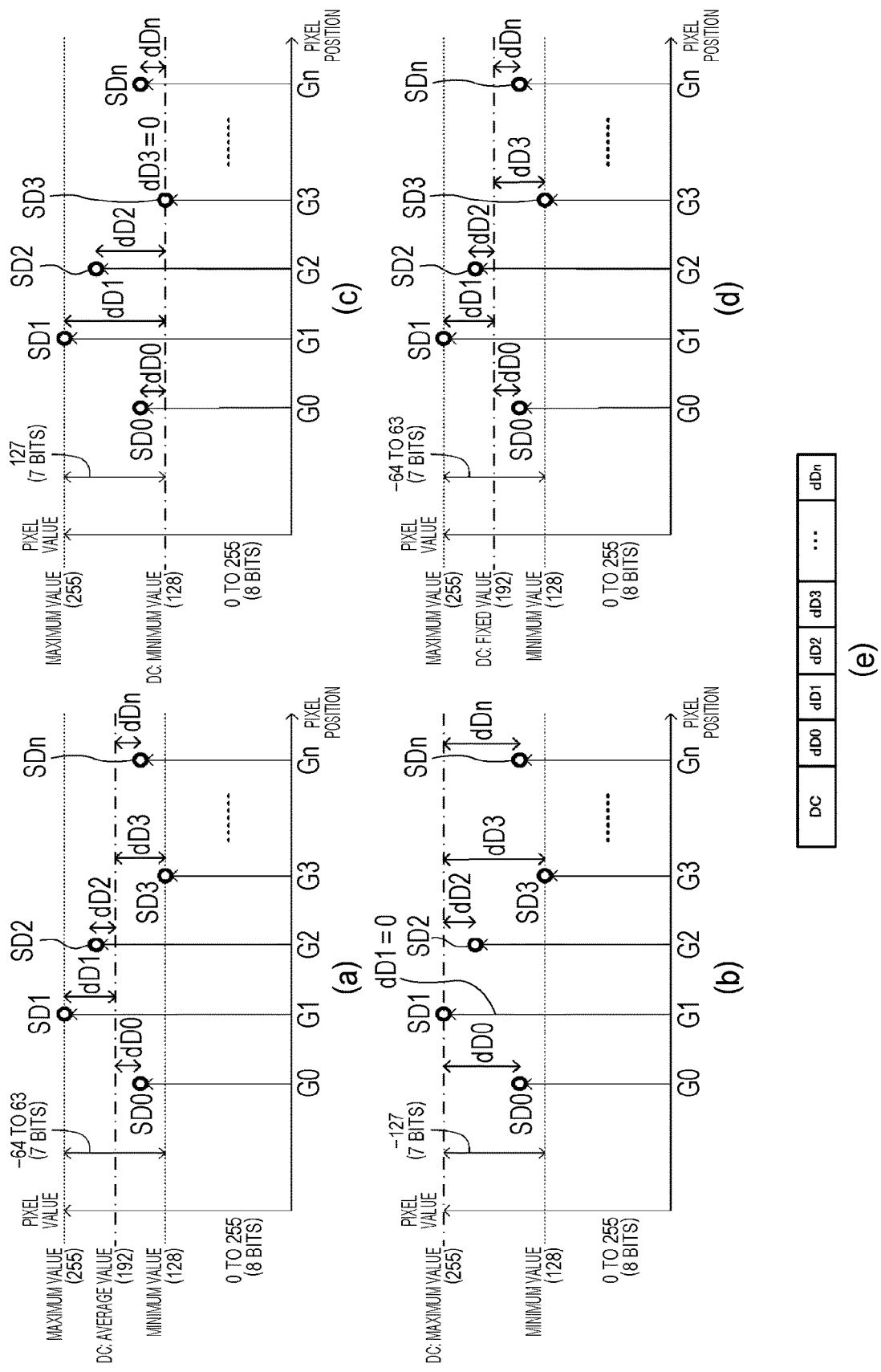
FIG. 15 is a diagram for describing a first operation.

Next, the first operation in the first embodiment of the information compression unit will be described. FIG. 15 is a diagram for describing the first operation. The reference setting unit 3111 sets a preset value or an average value of the pixel output information as reference value information DC.

FIG. 15 is an example in a case where the pixel output information having a bit width (bit depth) of 8 bits is processed. The maximum value of the pixel output information, that is, the pixel values of all the pixel output units is, for example, the pixel value "SD1=255" at the pixel position G1 (position of the pixel output unit (hereinafter referred to as "pixel position")). The minimum value of the pixel values of all the pixel output units is, for example, the pixel value "SD3=128" at the pixel position G3. Furthermore, FIG. 15 illustrates a case where the average value of the pixel values of all the pixel output units is, for example, "192."

Note that all the pixel output units may be, for example, all the pixel output units of an image immediately before recording, all the pixel output units of an image of a live view image at desired timing, and the like. In a case where the pixel output information output from the image capturing unit 121 (221) is processed off-line, all the pixel output units are all the pixel output units of the image to be subjected to compression processing.

The difference calculation unit 3112 computes the difference dD0 between the reference value information DC and the pixel output SD0 at the pixel position G0. Furthermore, the difference calculation unit 3112 computes the difference dD1 between the reference value information DC and the pixel output SD1 at the pixel position G1. In a similar manner below, the difference calculation unit 3112 computes the difference dDn between the reference value information DC and the pixel output SDn at the pixel position Gn, and generates compressed information indicating the reference value information DC and the differences dD0 . . . dDn computed by respective pixel output units.

(a) of FIG. 15 illustrates a case where the average value of the pixel values of all the pixel output units is used as the reference value information DC. In this case, the minimum value of the difference values dD0 to dDn is "128−192=−64" and the maximum value is "255−192=63" with respect to the average value. That is, the bit width required to store the difference values dD0 to dDn is 7 bits. Therefore, in the compressed information shown in (e) of FIG. 15, the amount of data before compression "8 bits×(n+1) pixel output units" can be reduced to the amount of data "8 bits (amount of data of the reference value information DC)+7 bits×(n+1) pixel output units."

(b) of FIG. 15 illustrates a case where the maximum value of the pixel values of all the pixel output units is used as the reference value information DC. In this case, the minimum value of the difference values dD0 to dDn is "128−255=−127" with respect to the maximum value. That is, the bit width required to store the difference values dD0 to dDn is 7 bits. Therefore, in the compressed information shown in (e) of FIG. 15, the amount of data before compression "8 bits×(n+1) pixel output units" can be reduced to the amount of data "8 bits (amount of data of the reference value information DC)+7 bits×(n+1) pixel output units."

(c) of FIG. 15 illustrates a case where the minimum value of the pixel values of all the pixel output units is used as the reference value information DC. In this case, the maximum value of the difference values dD0 to dDn is "255−128=127" with respect to the minimum value. That is, the bit width required to store the difference values dD0 to dDn is 7 bits. Therefore, in the compressed information shown in (e) of FIG. 15, the amount of data before compression "8 bits×(n+1) pixel output units" can be reduced to the amount of data "8 bits (amount of data of the reference value information DC)+7 bits×(n+1) pixel output units."

(d) of FIG. 15 illustrates a case where a fixed value (for example, "192") is used as the reference value information DC. In this case, the minimum value of the difference values dD0 to dDn is "128−192=−64" and the maximum value is "255−192=63" with respect to the fixed value. That is, the bit width required to store the difference values dD0 to dDn is 7 bits. Therefore, in the compressed information shown in (e) of FIG. 15, the amount of data before compression "8 bits×(n+1) pixel output units" can be reduced to the amount of data "8 bits (amount of data of the reference value information DC)+7 bits×(n+1) pixel output units."

Figure 16:
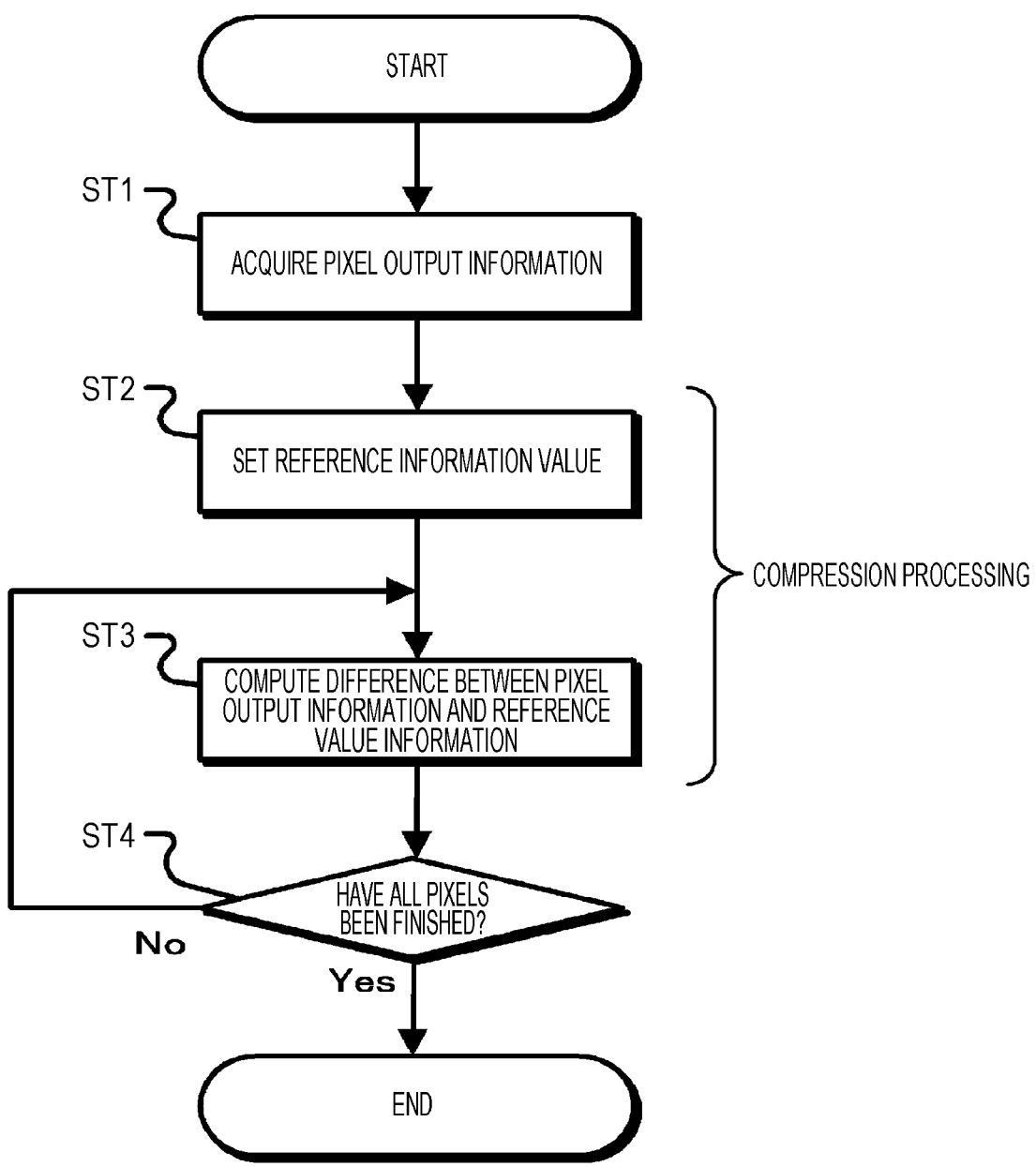
FIG. 16 is a flowchart showing the first operation.

FIG. 16 is a flowchart showing the first operation. In step ST1, the information compression unit acquires the pixel output. The information compression unit acquires the pixel output generated by the image capturing unit, and proceeds to step ST2.

In step ST2, the information compression unit sets the reference value information. The information compression unit sets the average value, minimum value, maximum value, or fixed value of the pixel values of all the pixel output units as the reference value information, and proceeds to step ST3.

In step ST3, the information compression unit computes the difference between the pixel output and the reference value information. The information compression unit computes the difference between the pixel output and the reference value information set in step ST2, uses the computation result as the compressed information, and proceeds to step ST4.

In step ST4, the information compression unit determines whether all the pixels have been finished. In a case where the generation of the compressed information for all the pixel output units has not been completed, the information compression unit returns to step ST3, and computes the difference between the pixel output of the new pixel output unit and the reference value information. In a case where the generation of the compressed information for all the pixel output units is completed, the information compression unit finishes image compression processing of one screen. Furthermore, in a case where moving image compression processing is performed, the information compression unit may perform the processing shown in FIG. 16 for each image. The information compression unit may perform the processing of step ST2 on the first image, and may use the reference value information set in the first image in subsequent compression processing.

Note that in a case where the expansion processing is performed on the compressed information generated in the first operation, the information expansion unit 321 reconstructs the pixel output information before the compression processing by adding the difference between the reference value information and each pixel output unit.

<6-2. Second Operation in First Embodiment>

Figure 17:
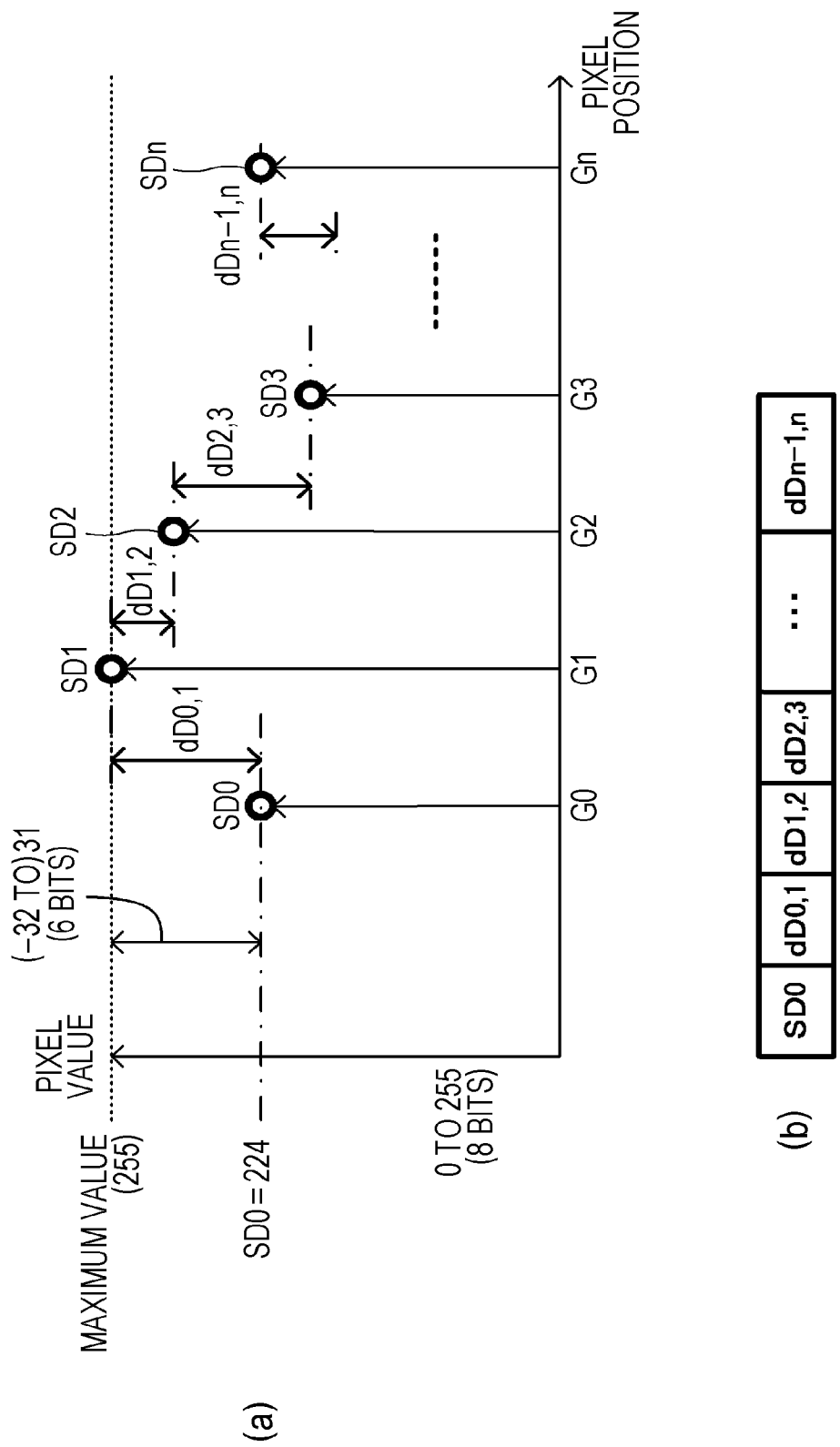
FIG. 17 is a diagram for describing a second operation.

Next, the second operation in the first embodiment of the information compression unit will be described. FIG. 17 is a diagram for describing the second operation. In the second operation, the reference setting unit 3111 sets and updates the reference value information, and the difference calculation unit 3112 computes the difference between the sequentially updated reference value information and the pixel output of the pixel output unit to be subjected to compression processing.

In FIG. 17, the pixel value of the head pixel output unit is, for example, the pixel value "SD0=224" at the pixel position G0. Furthermore, the maximum difference value of the pixel values between the adjacent pixel output units is, for example, "31", and the minimum difference value of the pixel values between the adjacent pixel output units is, for example, "−32." Furthermore, since the maximum value of the pixel values of all the pixel output units is "255", the bit width required to store the pixel values is 8 bits.

For example, as shown in (a) of FIG. 17, the reference setting unit 3111 uses the pixel output SD0 at the pixel position G0 as the reference value information, and the difference calculation unit 3112 computes the difference dD0,1 between the pixel output SD0 that is the reference value information and the pixel output SD1 at the pixel position G1. Furthermore, the reference setting unit 3111 uses the pixel output SD1 at the pixel position G1 as the reference value information, and the difference calculation unit 3112 computes the difference dD1,2 between the pixel output SD1 that is the reference value information and the pixel output SD2 at the pixel position G2. In a similar manner below, the reference setting unit 3111 updates the reference value information sequentially, the difference calculation unit 3112 computes the difference dDn−1, n between the pixel output SDn−1 that is the updated reference value information and the pixel output SDn at the pixel position Gn, and generates compressed information indicating the pixel value SD0 of the head pixel and the differences dD0,1 . . . dDn−1, n computed at each pixel.

In this case, since the maximum value of the difference values dD0,1 to dDn−1, n is "31" and the minimum value is "−32", the bit width required to store the difference values dD0,1 to dDn−1, n is 6 bits. Therefore, in the compressed information shown in (b) of FIG. 17, the amount of data before compression "8 bits×(n+1) pixel output units" can be reduced to the amount of data "8 bits (amount of data of the pixel value of the head pixel output unit)+6 bits×n pixel output units."

Figure 18:
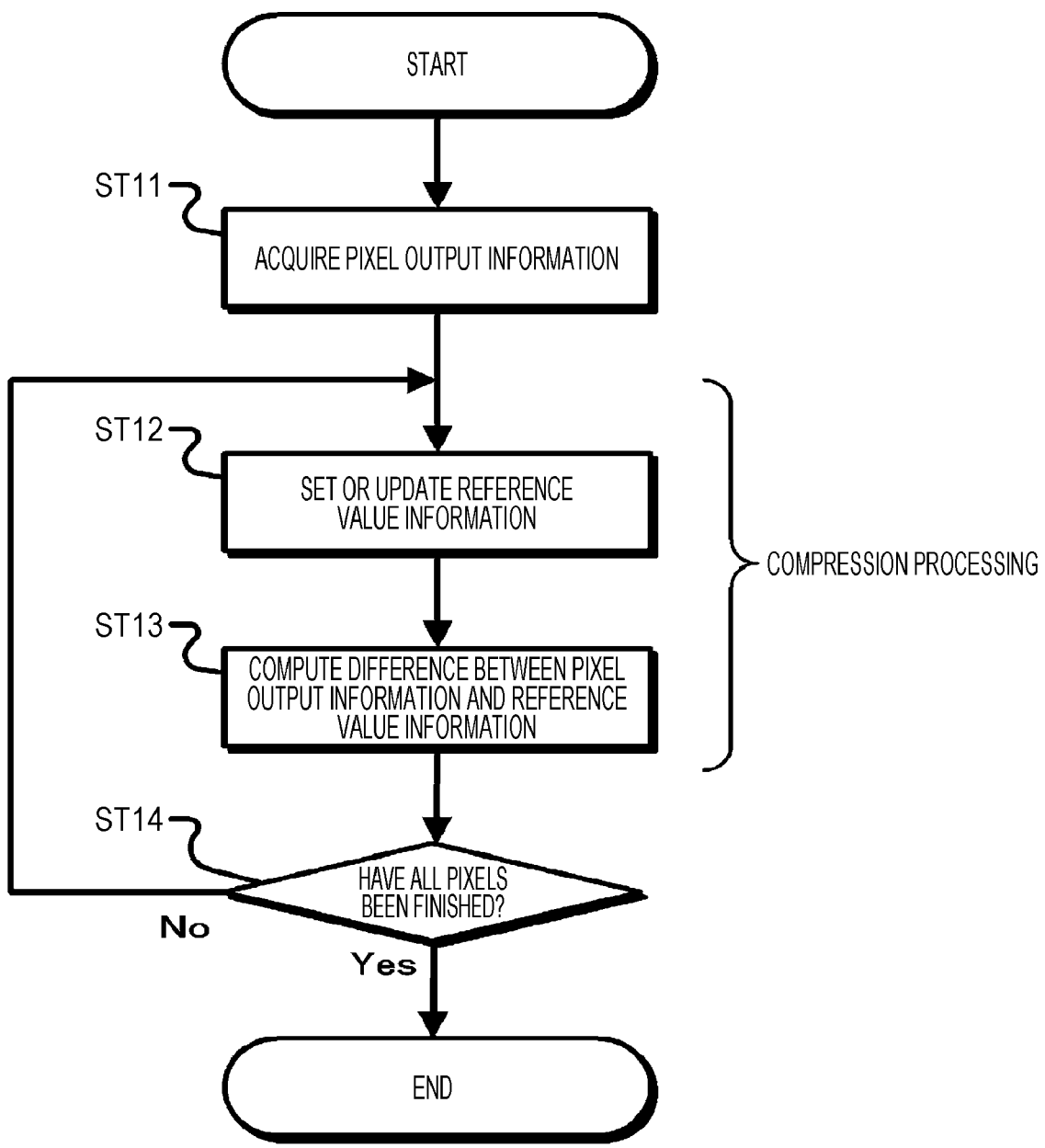
FIG. 18 is a flowchart showing the second operation.

FIG. 18 is a flowchart showing the second operation. In step ST11, the information compression unit acquires the pixel output. The information compression unit acquires the pixel output generated by the image capturing unit, and proceeds to step ST12.

In step ST12, the information compression unit sets or updates the reference value information. The information compression unit sets the pixel output of the first pixel output unit as the reference value information, and proceeds to step ST13.

Furthermore, in a case where the reference value information has been set, the information compression unit uses the pixel output of the pixel output unit that has performed compression processing immediately before as new reference value information, and proceeds to step ST13

In step ST13, the information compression unit computes the difference between the pixel output and the reference value information. The information compression unit computes the difference between the pixel output and the reference value information set or updated in step ST12, uses the computation result as the compressed information, and proceeds to step ST14

In step ST14, the information compression unit determines that all the pixels have been finished. In a case where the generation of the compressed information for all the pixel output units has not been completed, the information compression unit returns to step ST12. In a case where the generation of the compressed information for all the pixel output units has been completed, the information compression unit finishes the image compression processing of one screen. Furthermore, in a case where the moving image compression processing is performed, the information compression unit performs the processing shown in FIG. 18 for each image.

Note that in a case where expansion processing of the compressed information generated in the second operation is performed, the information expansion unit 321 computes the pixel output of the pixel output unit corresponding to the difference by adding the reference value information to the difference, and computes the pixel output of the pixel output unit corresponding to the difference by adding the difference with the pixel output as new reference value information. The information expansion unit 321 reconstructs the pixel output information before compression processing by repeating such processing.

<6-3. Third and Fourth Operations in First Embodiment>

Figure 19:
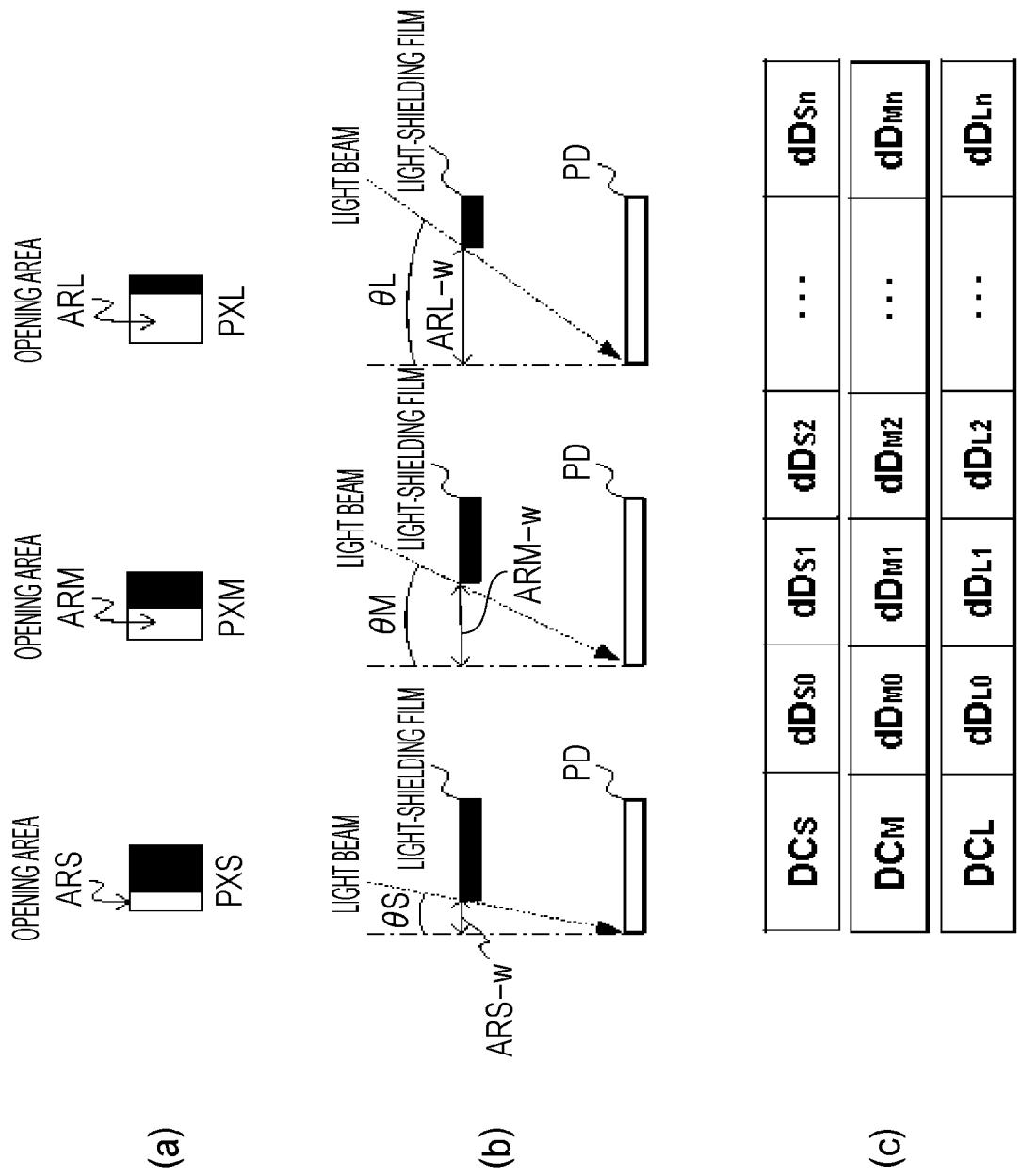
FIG. 19 is a diagram for describing a third operation.

Next, the third operation in the first embodiment of the information compression unit will be described. FIG. 19 is a diagram for describing the third operation. Pixel output information on which the information compression unit performs the compression processing is the pixel output information generated by the image capturing unit 121 described above. Furthermore, the image capturing unit 121 is configured such that the incident angle directivity differs depending on the difference in the area of the opening part, which is the light-receiving region of the pixel.

The information compression unit 311-1 performs grouping on the basis of the opening area, and performs the compression processing on each group. Note that the information compression unit 311-1 recognizes in advance how pixels having different opening areas are arranged in the image capturing unit 121.

(a) of FIG. 19 illustrates the difference in the pixel opening area. Note that in the diagram, the opening part is indicated by a white region. For example, in the image capturing unit 121, a pixel PXS with the opening area ARS, a pixel PXM with the opening area being an opening area ARM larger than the pixel PXS, and a pixel PXL with the opening area being an opening area ARL larger than the pixel PXM are provided.

(b) of FIG. 19 is a schematic diagram showing the relationship between the opening of the pixel and the incident angle directivity. Note that in (b) of FIG. 19, when the opening area is ARS, the opening width is the width ARS-w, when the opening area is ARM, the opening width is the width ARM-w, and when the opening area is ARL, the opening width is the width ARL-w. Furthermore, for simplicity of description, it is assumed that there is no incidence of a light beam from outside the end of the photodiode PD (light beam from the left side of the position of the alternate long and short dashed line). In this case, when the opening area is ARS, the light beam with the incident angle in the range of "0 to θS" enters the photodiode PD. Furthermore, when the opening area is ARM, the light beam with the incident angle in the range of "0 to θM" enters the photodiode PD, and when the opening area is ARL, the light beam with the incident angle in the range of "0 to θL" enters the photodiode PD. That is, the image capturing unit 121 has different incident angle directivity depending on the area of the opening part.

The information compression unit 311-1 performs grouping into the pixel group of the opening area ARS, the pixel group of the opening area ARM, and the pixel group of the opening area ARL, and performs the first operation or second operation on each group. (c) of FIG. 19 is a diagram illustrating a case where the above first operation is performed on each of the pixel group of the opening area ARS, the pixel group of the opening area ARM, and the pixel group of the opening area ARL to generate the compressed information. Note that (c) of FIG. 19 shows the compressed information of the pixel group of the opening area ARS, the pixel group of the opening area ARM, and the pixel group of the opening area ARL in order from the top.

Figure 20:
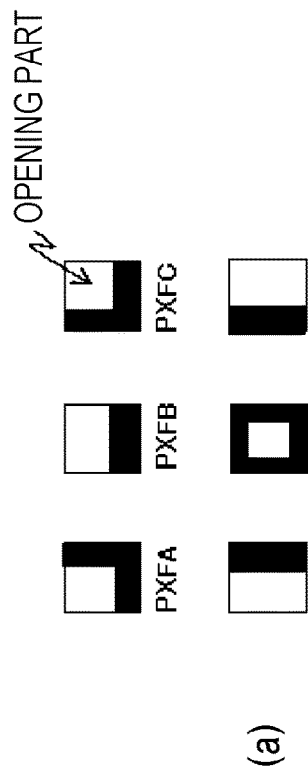
FIG. 20 is a diagram for describing a fourth operation.

Next, the fourth operation in the first embodiment of the information compression unit will be described. FIG. 20 is a diagram for describing the fourth operation. Pixel output information on which the information compression unit performs the compression processing is the pixel output information generated by the image capturing unit 121 described above. Furthermore, the image capturing unit 121 is configured such that the incident angle directivity differs depending on the difference in the direction of the opening part, which is the light-receiving region of the pixel.

The information compression unit 311-1 performs grouping on the basis of the opening direction, and performs compression processing on each group. Note that the information compression unit 311-1 recognizes in advance how pixels having different opening directions are arranged in the image capturing unit 121.

(a) of FIG. 20 illustrates the difference in the opening direction of pixels. Note that in the diagram, the opening part is indicated by a white region. For example, the image capturing unit 121 is provided with the pixel PXFA with the opening part on the upper left side, the pixel PXFB with the opening part on the upper side, the pixel PXFC with the opening part on the upper right side, the pixel PXFD with the opening part on the left side, the pixel PXFE with the opening part in the center, the pixel PXFF with the opening part on the right side, the pixel PXFG with the opening part on the lower left side, the pixel PXFH with the opening part on the lower side, and the pixel PXFI with the opening part on the lower right side.

The information compression unit 311-1 performs grouping for each opening direction and performs the first operation or the second operation described above on each group. (b) of FIG. 20 illustrates a case where the first operation is performed on each pixel group for each opening direction to generate the compressed information. Note that (b) of FIG. 20 shows the compressed information of the pixel PXFA group, the pixel PXFB group, ..., the pixel PXFI group in order from the top.

In the third and fourth operations, the compression processing is performed for each group as described above. Therefore, in a case where expansion processing of the compressed information is performed, the information expansion unit needs to reproduce arrangement of pixels with different opening areas and arrangement of pixels with different opening directions. Therefore, in a case where the compression processing is performed on each group, in association of the arrangement information indicating the arrangement order of pixels with different opening areas and pixels with different opening directions with the compressed information, by performing expansion processing for each pixel group having a different opening area or opening direction, the information expansion unit 321 returns the pixel output information returned before compression to an arrangement before the compression processing on the basis of the arrangement information.

If such an operation of either of the first to fourth operations is performed, it is possible to reduce the amount of data of the pixel output information generated by the image capturing unit 121 (221), and to reduce the load on storing and transmitting the pixel output information when a long time capturing is performed or a large number of images are captured. Furthermore, since differential compression is performed using that the pixel output information generated by the image capturing unit 121 (221) has a relatively uniform signal level over the entire screen, the amount of data of the pixel output information can be easily and effectively reduced.

<7. Configuration and Operation of Second Embodiment of Information Compression Unit>

Figure 21:
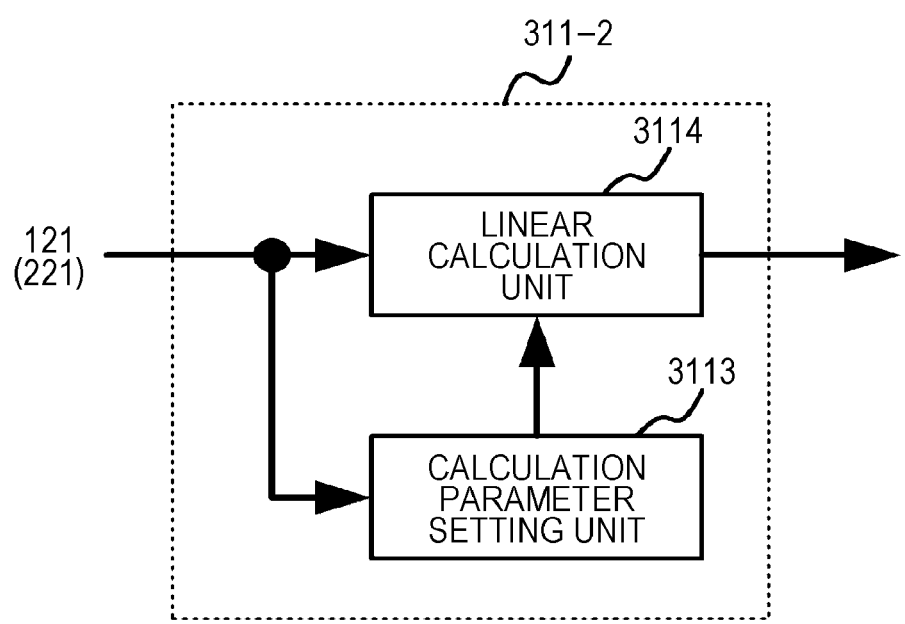
FIG. 21 is a diagram illustrating a configuration of a second embodiment of the information compression unit.

FIG. 21 is a diagram illustrating the configuration of the second embodiment of the information compression unit. As described above, in the pixel output information, the difference in the detected value of the light intensity between the pixel output units is smaller than in a case where the image capturing lens is used. Therefore, an information compression unit 311-2 performs linear calculation and reduces a word length of a pixel output that is output from an image capturing unit 121 (221), thereby reducing an amount of data. The information compression unit 311-2 includes, for example, a calculation parameter setting unit 3113 and a linear calculation unit 3114. The calculation parameter setting unit 3113 sets a calculation parameter for reducing the word length by linear calculation. The linear calculation unit 3114 performs linear calculation on the calculation parameter set by the calculation parameter setting unit 3113 and reference value information, and generates compressed information having an amount of data smaller than the pixel output information.

Next, the operation of the information compression unit in the second embodiment will be described. The calculation parameter setting unit 3113 sets the calculation parameter for narrowing a range of a value that the pixel output can take on the basis of the amount of light during image capturing, exposure control value (for example, a period of exposure to light or gain of gain control by signal processing on the pixel output when the image capturing unit 121 (221) generates the pixel output), and the like. Specifically, the calculation parameter DPa is set according to the aperture, period of exposure to light, gain, and the like such that the pixel output falls within the range of the value the pixel output can take.

Furthermore, the calculation parameter setting unit 3113 may set the calculation parameter DPb for reducing the word length assigned to the pixel output. The calculation parameter setting unit 3113 sets a subtraction value or a division value according to the word length after the reduction (referred to as target bit width) from the pixel output of the image capturing unit 121 as the calculation parameter DPb.

For example, in a case where the linear calculation unit 3114 performs subtraction, as the maximum value of the image output information increases, the linear calculation unit 3114 increases the value of the calculation parameter, and the linear calculation unit 3114 subtracts the calculation parameter DPb from the pixel output, and sets the pixel output information as the compressed information of the target bit width.

Figure 22:
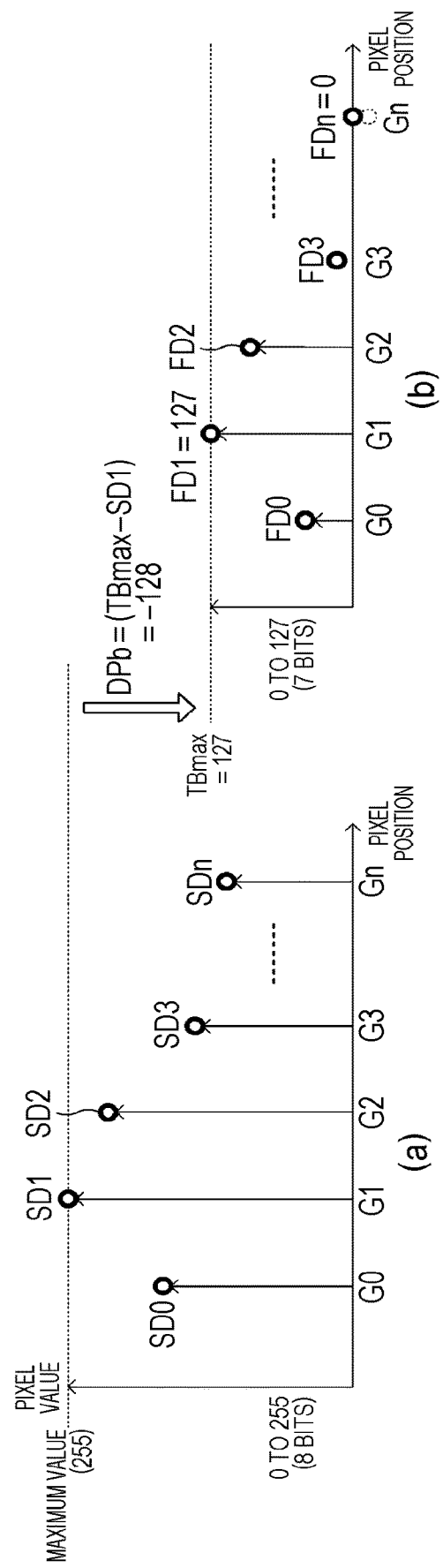
FIG. 22 is a diagram illustrating an operation of the second embodiment of the information compression unit.

FIG. 22 is a diagram illustrating the operation of the second embodiment of the information compression unit. (a) of FIG. 22 illustrates the pixel output information before compression. The maximum value of the pixel values of all the pixel output units is, for example, the pixel value "SD1=255" at the pixel position G1. The minimum value of the pixel values of all the pixel output units is, for example, the pixel value "SDn=100" at the pixel position Gn. In this case, since the maximum value is "255", the bit width required to store the pixel value is 8 bits.

The calculation parameter setting unit 3113 sets the difference between the maximum value of the pixel output information before linear calculation (for example, SD1) and the target bit width (TBmax) as the calculation parameter DPb. By subtracting the calculation parameter from the pixel output information, the linear calculation unit 3114 sets the pixel output information as the compressed information of the target bit width. For example, in a case where the target bit width (TBmax) is 7 bits, since the maximum value of the pixel output information is "255" and the maximum value in the 7-bit range is 127, the calculation parameter DPb is set at "255−127=128."

The linear calculation unit 3114 computes the calculated value FD0 by subtracting the calculation parameter DPb from the pixel output SD0 at the pixel position G0. Furthermore, the linear calculation unit 3114 computes the calculated value FD1 by subtracting the calculation parameter DPb from the pixel output SD1 at the pixel position G1. In a similar manner below, the linear calculation unit 3114 computes the calculated value FDn by subtracting the calculation parameter DPb from the pixel output SDn at the pixel position Gn, and generates the compressed information indicating the calculated values FD0, FD1, . . . FDn computed in respective pixels. Note that in a case where the subtraction result is a negative value, the pixel output is set at "0." In this way, by subtracting the calculation parameter from the pixel output information, the pixel output information after compression (corresponding to the compressed information) shown in (b) of FIG. 22 is generated. Therefore, in the compressed information shown in (b) of FIG. 22, the amount of data before compression "8 bits×(n+1) pixel output units" can be reduced to the amount of data "7 bits×(n+1) pixel output units."

Figure 23:
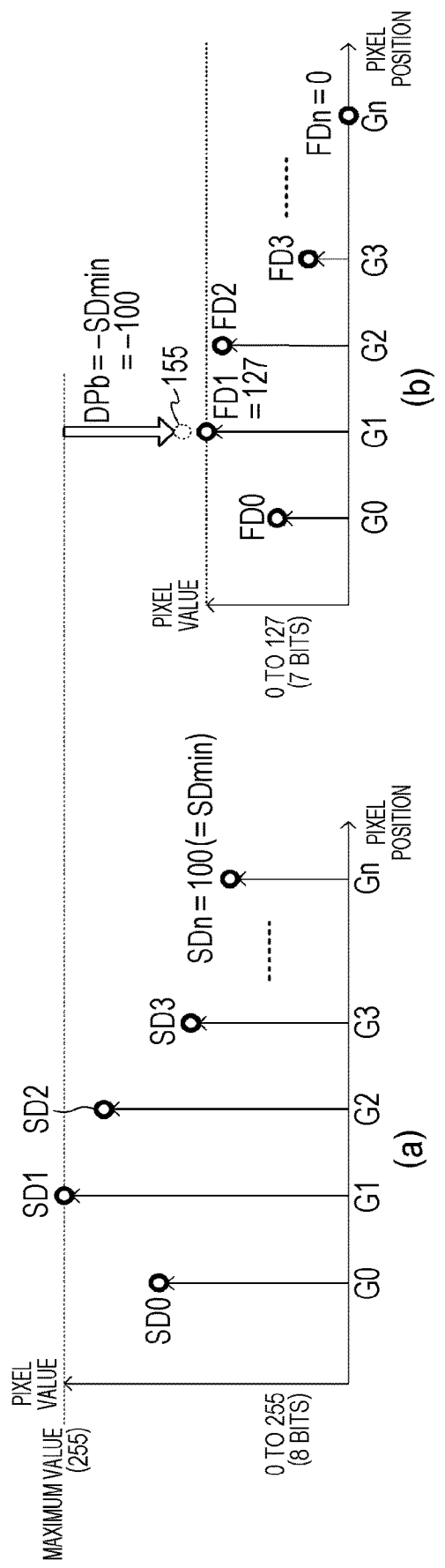
FIG. 23 is a diagram showing another example of the operation of the second embodiment of the information compression unit.

FIG. 23 is a diagram showing another example of the second embodiment of the information compression unit. (a) of FIG. 23 illustrates the pixel output information before compression. The maximum value of the pixel values of all the pixel output units is, for example, the pixel value "SD1=255" at the pixel position G1. The minimum value of the pixel values of all the pixel output units is, for example, the pixel value "SDn=100" at the pixel position Gn. In this case, since the maximum value is "255", the bit width required to store the pixel value is 8 bits.

The calculation parameter setting unit 3113 sets a value with which the minimum value of the pixel output information before linear calculation (for example, SDn) is compressed to the minimum value of the target bit width (TBmax) as the calculation parameter DPb. By subtracting the calculation parameter from the pixel output information, the linear calculation unit 3114 sets the pixel output information as the compressed information of the target bit width. For example, in a case where the target bit width (TBmax) is 7 bits, since the minimum value of the pixel output information is "100" and the minimum value in the 7-bit range is 0, the calculation parameter DPb is set at "100−0=100."

The linear calculation unit 3114 computes the calculated value FD0 by subtracting the calculation parameter DPb from the pixel output SD0 at the pixel position G0. Furthermore, the linear calculation unit 3114 computes the calculated value FD1 by subtracting the calculation parameter DPb from the pixel output SD1 at the pixel position G1. In a similar manner below, the linear calculation unit 3114 computes the calculated value FDn by subtracting the calculation parameter DPb from the pixel output SDn at the pixel position Gn, and generates the compressed information indicating the calculated values FD0, FD1, . . . FDn computed in respective pixels. Note that in a case where the subtraction result exceeds the maximum value "127" in the 7-bit range, the pixel output is set at "127."

In this way, by subtracting the calculation parameter from the pixel output information, the pixel output information after compression (corresponding to the compressed information) shown in (b) of FIG. 23 is generated. Therefore, in the compressed information shown in (b) of FIG. 23, the amount of data before compression "8 bits×(n+1) pixel output units" can be reduced to the amount of data "7 bits×(n+1) pixel output units."

Furthermore, in the operations shown in FIGS. 22 and 23, the case where the linear calculation for computing the calculated value FDn by subtracting the calculation parameter DPb from the pixel output SDn has been described. However, the linear calculation is not limited to the case where the calculation parameter DPb is subtracted from the pixel output SDn. For example, the calculated value may be computed by dividing the pixel output SDn by the calculation parameter DPb. In this case, as the calculation parameter DPb, a ratio of the maximum value of the pixel output information before compression to the maximum value of the target bit width is set as the calculation parameter DPb. Furthermore, if the calculation parameter DPb is set, for example, at a power of 2 which is greater than the ratio of the maximum value of the pixel output information before compression to the maximum value of the target bit width, the linear calculation becomes easy.

Figure 24:
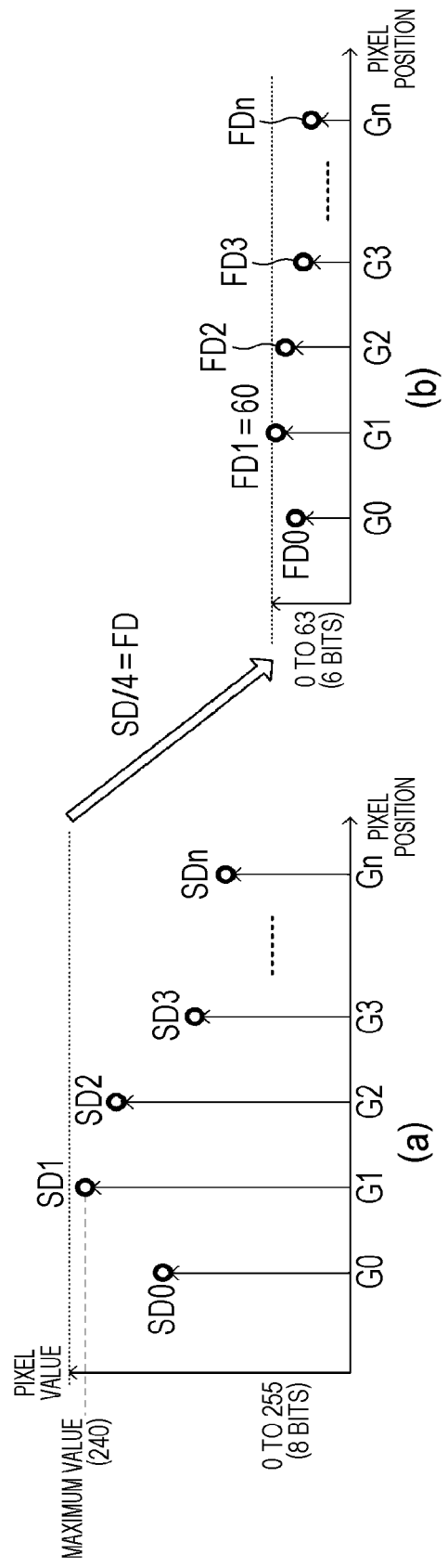
FIG. 24 is a diagram showing another example of the operation of the second embodiment of the information compression unit.

FIG. 24 is a diagram showing another example of the second embodiment of the information compression unit. (a) of FIG. 24 illustrates the pixel output information before compression. The maximum value of the pixel values of all the pixel output units is, for example, the pixel value "SD1=240" at the pixel position G1. In this case, since the maximum value is "240", the bit width required to store the pixel values is 8 bits.

The calculation parameter setting unit 3113 sets a power of 2 greater than a ratio of the maximum value of pixel output information before compression to the maximum value of the target bit width as the calculation parameter DPb to be used for dividing the pixel output SDn. The linear calculation unit 3114 sets the pixel output information as the compressed information of the target bit width by dividing the pixel output information by the calculation parameter. For example, in a case where the target bit width (TBmax) is 6 bits, since the maximum value of the pixel output information is "240" and the maximum value of the 6-bit range is 63, the calculation parameter DPb is set at "4."

The linear calculation unit 3114 computes the calculated value FD0 by dividing the pixel output SD0 at the pixel position G0 by the calculation parameter DPb. Furthermore, the linear calculation unit 3114 computes the calculated value FD1 by dividing the pixel output SD1 at the pixel position G1 by the calculation parameter DPb. In a similar manner below, the linear calculation unit 3114 computes the calculated value FDn by dividing the pixel output SDn at the pixel position Gn by the calculation parameter DPb, and generates the compressed information indicating the calculated values FD0, FD1, . . . FDn computed in respective pixels. In this way, by dividing the pixel output information by the calculation parameter, the pixel output information after compression (corresponding to the compressed information) shown in (b) of FIG. 24 is generated. Therefore, in the compressed information shown in (b) of FIG. 24, the amount of data before compression "8 bits×(n+1) pixel output units" can be reduced to the amount of data "6 bits×(n+1) pixel output units."

Moreover, the calculation parameter setting unit 3113 may set the calculation parameter DPa for narrowing a range of a value the pixel output can take on the basis of the amount of light during image capturing, exposure control value, and the like, and the calculation parameter DPb for reducing the bit width to be assigned to the pixel output. The calculation parameter setting unit 3113 sets the calculation parameter DPa such that, for example, in a reference exposure setting, the pixel output falls within a range of value the pixel output can take. Furthermore, the maximum value of the image output within the range of value the pixel output can take is set as the target bit width. Here, in order to avoid that the time of exposure to light and the gain are changed with respect to the reference exposure setting and the maximum value of the image output exceeds and becomes larger than the target bit width, the calculation parameter DPb with which the pixel output is set as the target bit width according to the time of exposure to light and gain is set. For example, in a case where the reference exposure setting is that the shutter speed is "(1/128) seconds" and the gain is "one time", in a case where the gain is set at "double", the calculation parameter DPb is set at the division value "2."

Furthermore, in a case where the shutter speed is set at "(1/64) seconds" and the gain is set at "double", the calculation parameter DPb is set at the division value "4."

In this way, the amount of data can be reduced by performing the linear calculation using one or both of the calculation parameters DPa and DPb. Note that in a case where the linear calculation is specified in advance, the compressed information may include the calculation parameter. The calculation parameter may be included in management data provided in association with the compressed information in order to manage the compressed information and the like. Furthermore, in a case where the linear calculation is not specified, the compressed information includes calculation information indicating what linear calculation is performed by the linear calculation unit 3114 to reduce the word length. Note that the calculation parameter does not need to be included in the compressed information if the calculation parameter can be set at the time of information expansion. For example, if the compressed information is a moving image, it is only required that for the first frame, the compressed information includes the calculation parameter, and for subsequent frames, the calculation parameter is computed from information of the previous frame. Furthermore, tag information of the compressed information may include the exposure control value and the like such that the calculation parameter can be set on the basis of the exposure control value and the like at the time of information expansion.

Figure 25:
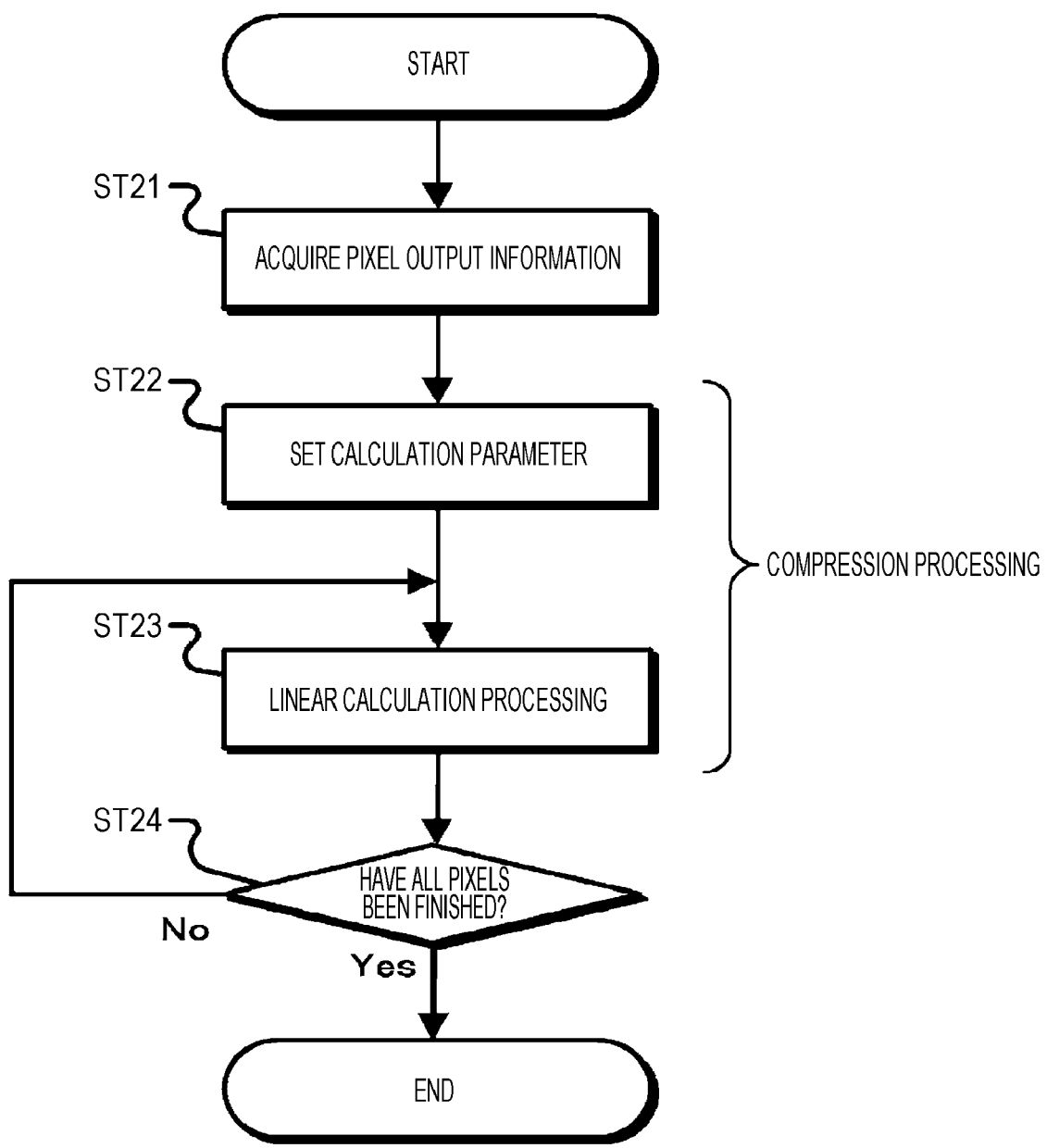
FIG. 25 is a flowchart showing the operation of the second embodiment of the information compression unit.

FIG. 25 is a flowchart showing the operation of the second embodiment of the information compression unit. In step ST21, the information compression unit acquires the pixel output. The information compression unit acquires the pixel output generated by the image capturing unit, and proceeds to step ST22.

In step ST22, the information compression unit sets the calculation parameter. The information compression unit sets the calculation parameter on the basis of the amount of light and the exposure control value at the time of image capturing, and proceeds to step ST23.

In step ST23, the information compression unit performs linear calculation processing. The information compression unit performs linear calculation using the pixel output and the calculation parameter set in step ST22 to reduce the word length of the pixel output. The information compression unit uses the calculation result as the compressed information and proceeds to step ST24

In step ST24, the information compression unit determines whether all the pixels have been finished. In a case where the generation of the compressed information for all the pixel output units has not been completed, the information compression unit returns to step ST23, and performs linear calculation on the pixel output of the new pixel output unit and the calculation parameter. In a case where the generation of the compressed information for all the pixel output units is completed, the information compression unit finishes image compression processing of one screen. Furthermore, in a case where moving image compression processing is performed, the information compression unit may perform the processing shown in FIG. 25 for each image. The information compression unit may perform the processing of step ST22 on the first image, and may use the calculation parameter set in the first image in subsequent compression processing.

Note that in a case where expansion processing of the compressed information generated in the second embodiment is performed, the information expansion unit 321 performs calculation opposite to the calculation of the linear calculation unit 3114 by using the pixel output information and the calculation parameter, thereby generating the pixel output information before the compression processing.

<8. Configuration and Operation of Third Embodiment of Information Compression Unit>

Figure 26:
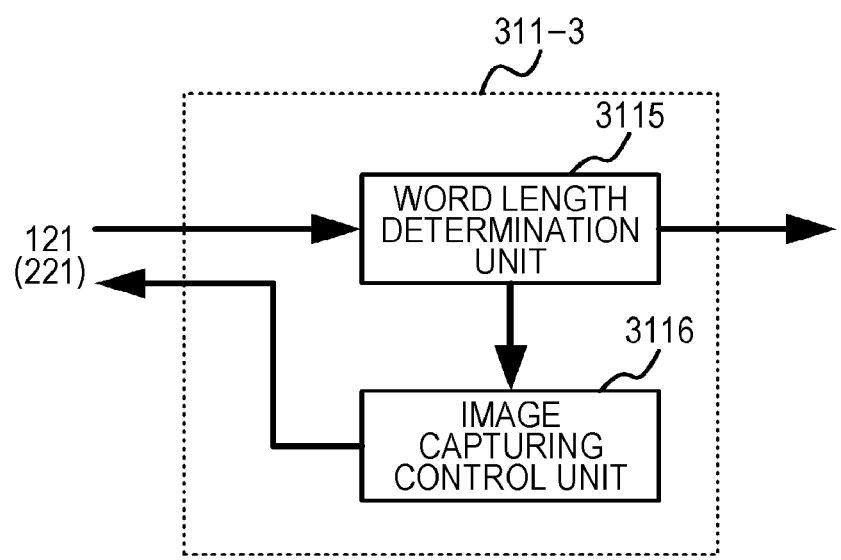
FIG. 26 is a diagram illustrating a configuration of a third embodiment of the information compression unit.

FIG. 26 is a diagram illustrating the configuration of the third embodiment of an information compression unit. As described above, in pixel output information, a difference in a detected value of light intensity between pixels is smaller than in a case where an image capturing lens is used. Therefore, an information compression unit 311-3 controls an image capturing unit 121 (221) such that the pixel output information output from the image capturing unit 121 (221) becomes information within a predetermined word length range.

The information compression unit 311-3 includes, for example, a word length discrimination unit 3115 and an image capturing control unit 3116. The word length discrimination unit 3115 discriminates the word length on the basis of the pixel output information output from the image capturing unit 121 (221). The word length discrimination unit 3115 may, for example, discriminate the maximum pixel value from the pixel output information of the first frame and discriminate the word length of the maximum pixel value. Since the difference between the detected values is small as described above, the word length discrimination unit 3115 may discriminate the word length for the pixel output information indicating the entire image on the basis of the pixel output of the first pixel output unit. The word length discrimination unit 3115 outputs a word length discrimination result to the image capturing control unit 3116. On the basis of the word length discrimination result, the image capturing control unit 3116 generates control information for performing exposure control such that the pixel output that is output from the image capturing unit 121 (221) falls within the desired word length, and outputs the control information to the image capturing unit 121 (221). On the basis of the control information, the image capturing unit 121 (221) adjusts, for example, the period of exposure to light, the gain, and the like when the image capturing unit 121 (221) generates the pixel output information, and outputs the compressed information, which is the pixel output information within the desired word length.

Figure 27:
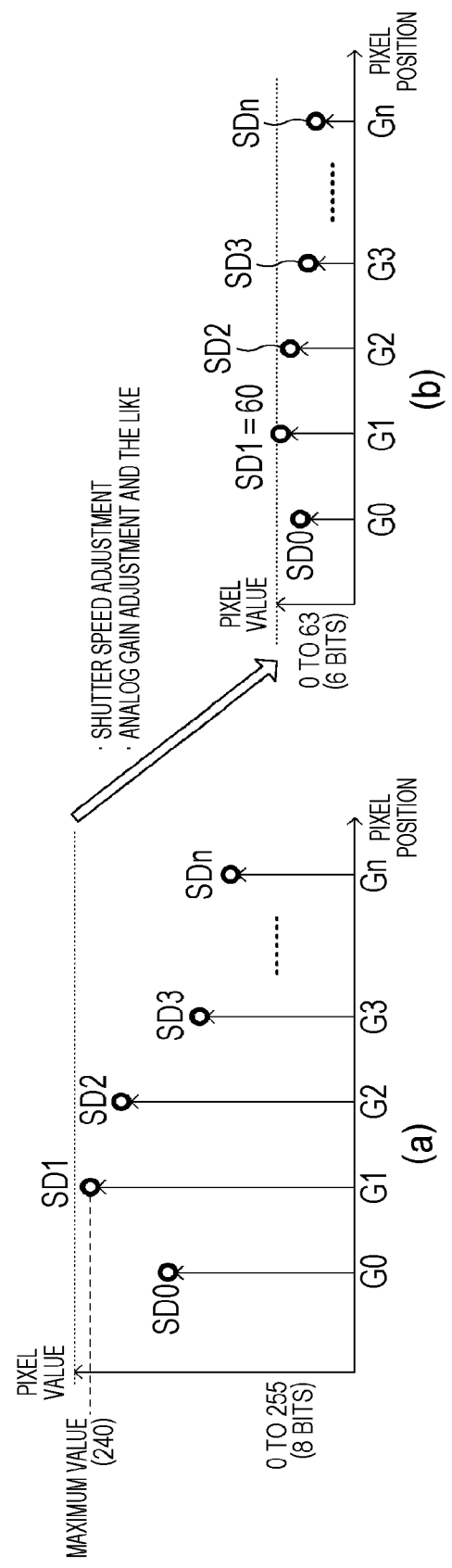
FIG. 27 is a diagram illustrating an operation of the third embodiment of the information compression unit.

FIG. 27 is a diagram illustrating the operation of the third embodiment of the information compression unit. (a) of FIG. 27 illustrates the pixel output information before compression. The maximum value of the pixel values of all the pixel output units is, for example, the pixel value "SD1=240" at the pixel position G1. In this case, since the maximum value is "240", the bit width required to store the pixel values is 8 bits.

For example, on the basis of the pixel output SD0 at the pixel position G0 or the pixel output SD0 at the pixel position G0 to the pixel output SDn at the pixel position Gn, the word length discrimination unit 3115 discriminates the word length of the pixel output and outputs the word length to the image capturing control unit 3116. The image capturing control unit 3116 generates the control information such that the pixel output that is output from the image capturing unit 121 (221) falls within a desired word length, and outputs the generated control information to the image capturing unit 121 (221). The image capturing unit 121 (221) performs exposure control on the basis of the control information supplied from the image capturing control unit 3116.

(b) of FIG. 27 illustrates a case where control is performed to reduce the pixel value to a quarter, for example, control to increase the shutter speed fourfold, to reduce the gain to a quarter, and the like on the basis of the control information supplied from the image capturing control unit 3116. In this case, since the control is performed to reduce the pixel value to a quarter, the pixel output information (pixel outputs SD0 to SDn) is a value within a 6-bit range. Therefore, in the compressed information shown in (b) of FIG. 27, the amount of data before compression "8 bits× (n+1) pixel output units" can be reduced to the amount of data "6 bits×(n+1) pixel output units."

Furthermore, if the exposure control is performed according to the word length discrimination result, for example, even in a case where the pixel value of the pixel output is smaller than the desired word length range and sufficient precision cannot be obtained, it is possible to generate the pixel output information that is within the desired word length and has a pixel value that is not too small.

Furthermore, the image capturing control unit 3116 is not limited to the case of controlling the period of exposure to light or analog gain. For example, the image capturing control unit 3116 may use the control information to adjust a range of a detected analog value to be converted into a digital signal by the image capturing unit 121 (221), perform bit expansion on the change in the detected value, and output the pixel output information such that the amount of change in the detected value with respect to a predetermined value (for example, minimum detected value and the like) falls within a desired word length range. In this way, by setting the amount of change in the detected value with respect to the predetermined value as the desired word length, the pixel output information can be generated with higher precision than in a case where the detected value is set as the desired word length.

Figure 28:
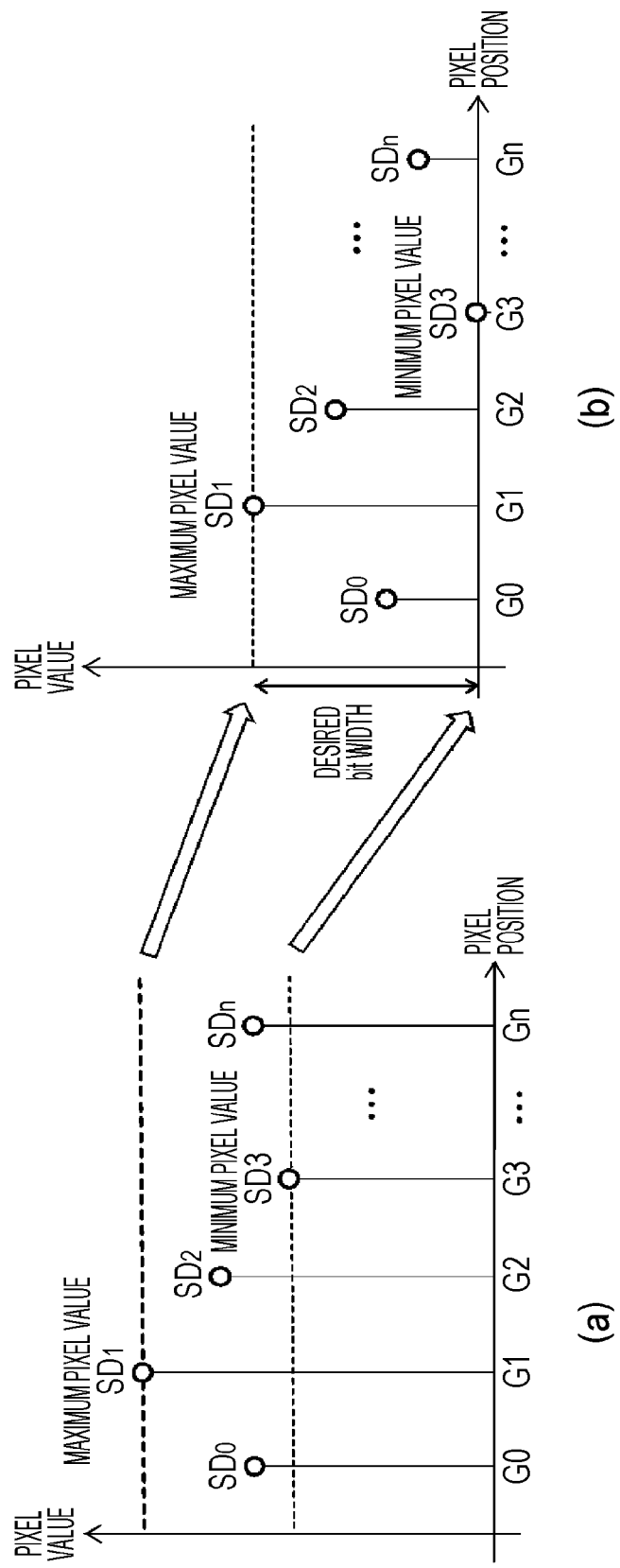
FIG. 28 is a diagram illustrating a bit expansion operation of a change in the detected value.

FIG. 28 is a diagram illustrating a bit expansion operation for the change in the pixel value. (a) of FIG. 28 illustrates the pixel output information before the bit expansion, and (b) of FIG. 28 illustrates the pixel output information after the bit expansion. For example, the word length discrimination unit 3115 discriminates the word lengths of the maximum pixel value and the minimum pixel value on the basis of the pixel output SD0 at the pixel position G0 to the pixel output SDn at the pixel position Gn, and outputs the word lengths to the image capturing control unit 3116. The image capturing control unit 3116 generates the control information such that the amount of change in the pixel value in the pixel output information output from the image capturing unit 121 (221) falls within the desired word length, and outputs the control information to the image capturing unit 121 (221). By performing the exposure control on the basis of the control information supplied from the image capturing control unit 3116, as shown in (b) of FIG. 28, the image capturing unit 121 (221) can generate the compressed information in which the amount of change in the pixel value is within the desired word length range.

Note that in a case where expansion processing of the compressed information generated in the third embodiment is performed, the information expansion unit 321 expands the word length of the pixel output information on the basis of the control information to generate the pixel output information before the compression processing.

<9. Another Operation of Information Compression Unit>

In that connection, the above-described embodiments have described the case where the image capturing unit 121 (221) is a monochrome sensor, but the image capturing unit 121 (221) may be a color sensor. For example, the image capturing unit 121 (221) is a color sensor in which a red component pixel (R), a green component pixel (Gr, Gb), and a blue component pixel (B) are provided as a Bayer array. Note that the green component pixel (Gr) is a green component pixel located in a row of red component pixels, and the green component pixel (Gb) is a green component pixel located in a row of blue component pixels. In this case, the information compression unit reduces the amount of data of the pixel output information for each color component. Furthermore, even in a case where complementary color pixels are used or the color arrangement is different from the Bayer array, the information compression unit performs the compression processing on the pixel output information for each color component.

Figure 29:
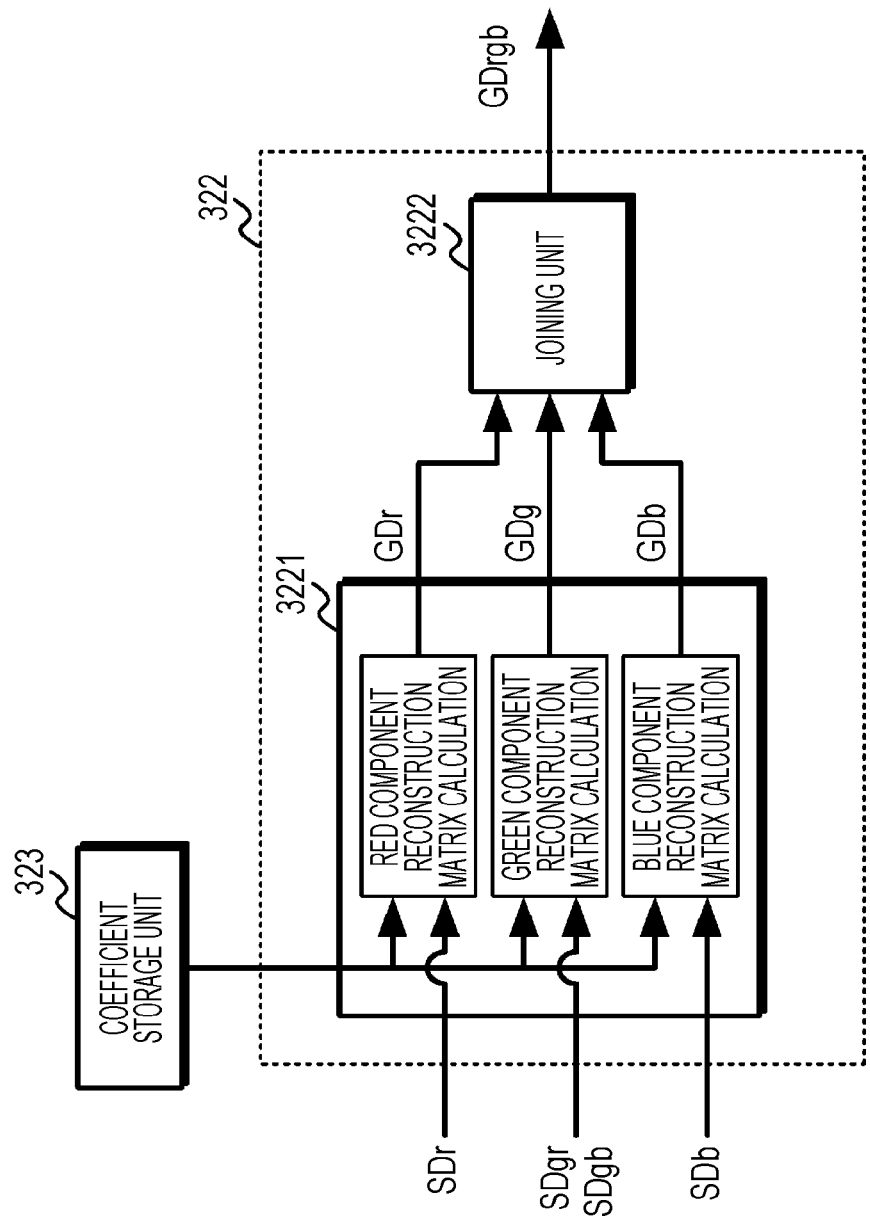
FIG. 29 is a diagram illustrating a configuration in a case where a color image signal is generated from a pixel output for each color component pixel.

Note that in a case where compression processing is performed on the pixel output information for each color component pixel, image conversion processing may be performed on each color component, and a color image signal may be generated from the image signal for each color component after the conversion. FIG. 29 is a diagram illustrating a configuration in a case where a color image signal is generated from the pixel output information of each color component. An image conversion unit 322 includes a color component image conversion unit 3221 and a coupling unit 3222.

The color component image conversion unit 3221 performs reconstruction calculation using red component pixel output information SDr and red component coefficient stored in the coefficient storage unit 323, and computes a pixel value GPr at each pixel position on the image capturing plane IP to generate a red component pixel signal GDr. Furthermore, the color component image conversion unit 3221 performs reconstruction calculation using green component pixel output information SDgr and SDgb and green component coefficient stored in the coefficient storage unit 323, and computes a pixel value GPg at each pixel position on the image capturing plane IP to generate a green component pixel signal GDg. Moreover, the color component image conversion unit 3221 performs reconstruction calculation using blue component pixel output information SDb and blue component coefficient stored in the coefficient storage unit 323, and computes a pixel value GPb at each pixel position on the image capturing plane IP to generate a blue component pixel signal GDb.

The coupling unit 3222 generates a color image signal of three primary colors GDrgb by using the red component pixel signal GDr, the green component pixel signal GDg, and the blue component pixel signal GDb.

<10. Another Configuration and Operation of Information Processing System>

Next, another configuration of the information processing system will be described. The other configuration of the information processing system shows a case where, in a case where the information compression unit reduces the word length of the pixel output information, image conversion is performed using the pixel output information with reduced word length, and word length reconstruction processing is performed on the image obtained by the image conversion.

Figure 30:
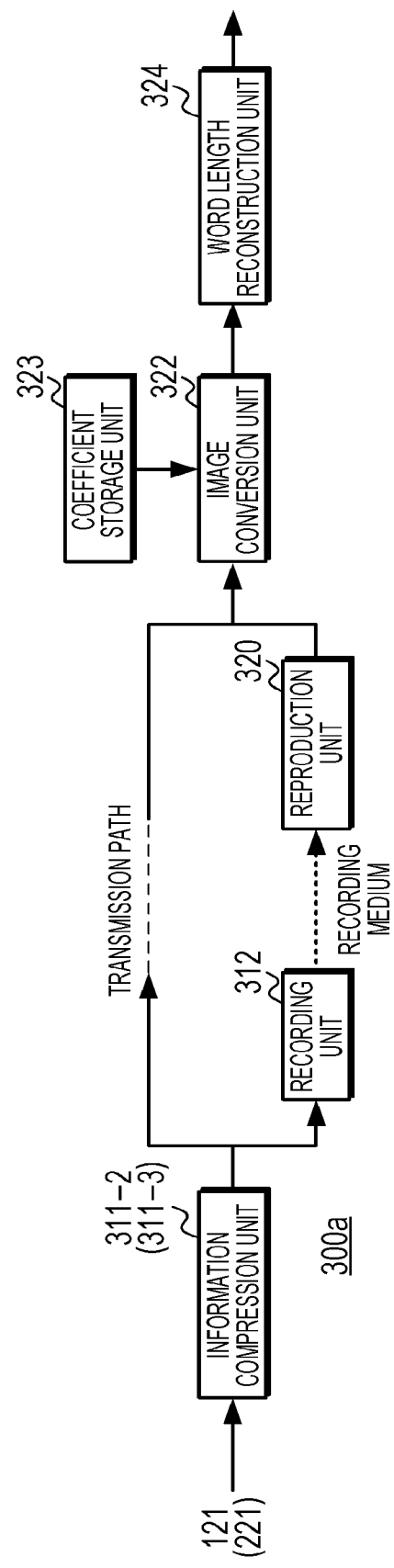
FIG. 30 is a diagram illustrating another configuration of the information processing system.

FIG. 30 is a diagram illustrating another configuration of the information processing system. An information processing system 300a includes an information compression unit 311-2(311-3), the recording unit 312, the reproduction unit 320, the image conversion unit 322, the coefficient storage unit 323, and a word length reconstruction unit 324. Note that the configuration of the information processing system 300a may be, in a similar manner to the information processing system 300, a configuration using only some blocks according to the operation performed by the information processing system 300a.

As described above, the image capturing unit 121 (221) generates the pixel output information of the pixel value according to the incident angle directivity.

The information compression unit 311-2 (311-3) reduces the word length of the pixel output information output from the image capturing unit 121 (221) to perform amount of data compression processing as described above, and outputs the compressed information to an external device by understanding the recording unit 312 or a transmission path.

The recording unit 312 records the compressed information generated by the information compression unit 311-2 (311-3) in a recording medium. Note that the recording medium may be detachable, or may be fixedly provided in a device in which the recording unit 312 and the reproduction unit 320 are integrated.

The reproduction unit 320 reads the compressed information recorded in the recording medium and outputs the compressed information to the image conversion unit 322.

The image conversion unit 322 performs reconstruction calculation using the compressed information supplied from the information compression unit 311-2 (311-3) or the reproduction unit 320 and the coefficient set group stored in the coefficient storage unit 323, and generates the pixel signal at the corresponding position in the object optical image in each pixel output unit. That is, the compressed information is information obtained by reducing the word length of the pixel value according to the incident angle directivity as described above. Therefore, the image conversion unit 322 performs reconstruction calculation using the coefficient set group stored in the coefficient storage unit 323 to generate the image signal of the captured image that allows visual recognition of the object, and outputs the image signal to the word length reconstruction unit 324.

The word length reconstruction unit 324 performs word length reconstruction processing corresponding to processing when generating the compressed information from the pixel output information. The word length reconstruction unit 324 performs processing of reconstructing the image signal affected by word length reduction to an image signal before compression that is not affected by word length reduction on the basis of the calculation parameter or the control information. For example, in a case where the compressed information is generated by the difference using the calculation parameter, the word length reconstruction unit 324 performs processing of adding the calculation parameter to the image signal output from the image conversion unit 322. Furthermore, in a case where the compressed information is generated by division using the calculation parameter, the word length reconstruction unit 324 performs processing of multiplying the image signal output from the image conversion unit 322 by the calculation parameter. Furthermore, in a case where the compressed information is generated by lowering the gain, the word length reconstruction unit 324 increases the gain by the amount of reduction in the image signal output from the image conversion unit 322. The word length reconstruction unit 324 performs such word length reconstruction processing, and reconstructs the image signal of the captured image in which the object captured by the image capturing unit 121 (221) has desired luminous intensity, and outputs the image signal after the word length reconstruction to a display unit or an external device.

As described above, the coefficient storage unit 323 stores in advance the coefficient set group to be used for the calculation for reconstructing the image signal indicating the captured image from the pixel output information.

Even by using such an information processing system 300a, it is possible to reduce the amount of data of the pixel output information and generate the image signal of the captured image that allows visual recognition of the object from the pixel output information with the amount of data reduced. Furthermore, it is possible to reduce the load on storing and transmitting the pixel output information when a long time capturing is performed or a large number of images are captured.

Note that in a case where a color sensor is used as the image capturing unit 121 (221), the image conversion unit 322 and the word length reconstruction unit 324 are only required to perform processing for each color component, and to generate the image signal of the captured color image by using the pixel signal of each color component generated by the word length reconstruction unit 324.

<11. Configuration and Operation of Image Capturing Device using Information Processing System>

Figure 31:
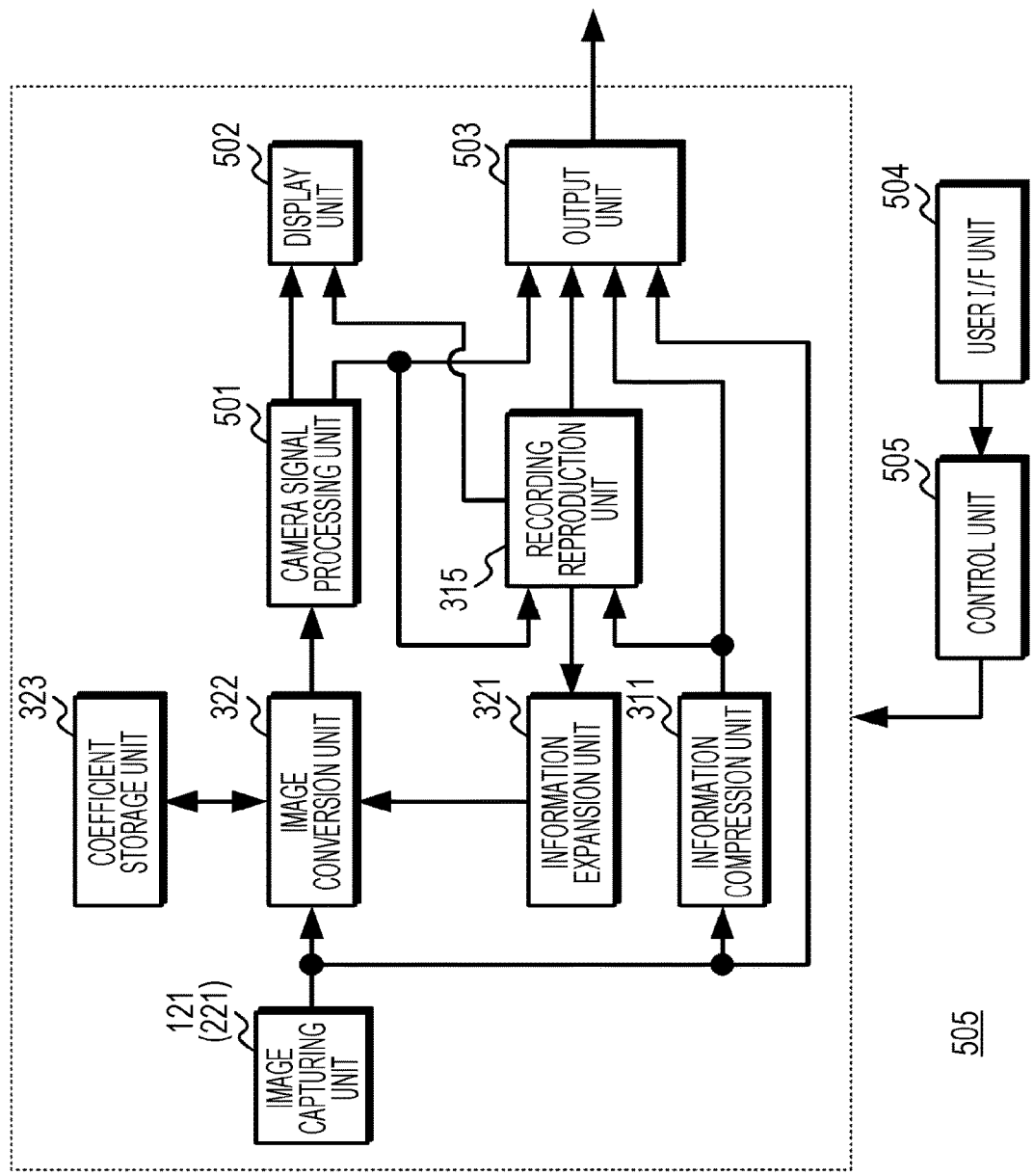
FIG. 31 is a diagram illustrating a configuration of an image capturing device.

Next, the configuration and operation of the image capturing device using the information processing system will be described. FIG. 31 illustrates the configuration of the image capturing device, and corresponds to the case where the information processing system 300 is applied.

The image capturing device 50 includes the image capturing unit 121 (221), the information compression unit 311, a recording reproduction unit 315, the information expansion unit 321, the image conversion unit 322, the coefficient storage unit 323, a camera signal processing unit 501, a display unit 502, an output unit 503, a user interface (I/F) unit 504, and a control unit 505.

As described above, the image capturing unit 121 (221) generates the pixel output information according to the incident angle directivity, and outputs the generated pixel output information to the information compression unit 311 and the output unit 503. Furthermore, the image capturing unit 121 (221) performs the image capturing operation and exposure control on the basis of a control signal from the control unit 505.

The information compression unit 311 performs amount of data compression processing on the pixel output information output from the image capturing unit 121 (221), and generates the compressed information. The information compression unit 311 outputs the generated compressed information to the recording reproduction unit 315 and the output unit 503.

The recording reproduction unit 315 records, in a recording medium, the compressed information generated by the information compression unit 311 and the image signal processed by the camera signal processing unit 501 as described later. Furthermore, the recording reproduction unit 315 reads the compressed information recorded in the recording medium and outputs the compressed information to the image conversion unit 322 or the output unit 503. Furthermore, the recording reproduction unit 315 reads the image signal recorded in the recording medium and outputs the image signal to the display unit 502 or the output unit 503. Note that the recording medium may be detachable, or may be fixedly provided in the recording reproduction unit 315.

The information expansion unit 321 performs expansion processing on the compressed information supplied from the recording reproduction unit 315, generates the pixel output information before compression processing, and outputs the generated pixel output information to the image conversion unit 322.

The image conversion unit 322 performs reconstruction calculation using the pixel output information supplied from the image capturing unit 121 (221) or the information expansion unit 321 and the coefficient set group stored in the coefficient storage unit 323, generates the pixel signal according to the image at the corresponding pixel position in the object optical image in each pixel, and outputs the pixel signal to the camera signal processing unit 501.

The coefficient storage unit 323 stores in advance the coefficient set group to be used for the calculation for generating the image signal of the captured image that allows visual recognition of the object from the pixel output information.

In a case where a color sensor including pixels of respective color components is used as the image capturing unit 121 (221), the camera signal processing unit 501 generates the image signal of each color component. Furthermore, the camera signal processing unit 501 performs gamma correction, white balance adjustment, and the like. The camera signal processing unit 501 outputs the processed image signal to the recording reproduction unit 315, the display unit 502, and the output unit 503.

The display unit 502 includes a liquid crystal display element, an organic EL display element, and the like. On the basis of the image signal output from the camera signal processing unit 501, the display unit 502 displays the image indicating the object captured by the image capturing unit 121 (221). Furthermore, the display unit 502 may perform menu display of the image capturing device 50, or display indicating a setting state or an operation state.

The output unit 503 selects either one of the pixel output information generated by the image capturing unit 121 (221), the compressed information generated by the information compression unit 311, the image signal processed by the camera signal processing unit 501, and the compressed information or image signal read from the recording medium by the recording reproduction unit 315. The output unit 503 outputs the selected information or signal to the outside. Note that in a case where the image signal is output, the output unit 503 may output the image signal to the outside after compressing the image signal in a predetermined compression format, for example, the joint photographic experts group (JPEG), graphics interchange format (GIF), and the like.

The user interface (I/F) unit 504 includes operation buttons, operation switches, and the like, generates an operation signal according to a user operation, and outputs the operation signal to the control unit 505.

The control unit 505 controls each unit on the basis of the operation signal from the user interface unit 504 such that the operation of the image capturing device 50 is an operation according to the user operation. For example, the control unit 505 controls each unit such that the image conversion unit 322 uses the coefficient set group corresponding to the object distance set by the user from the coefficient set group stored in the coefficient storage unit 323, and an image formed at the object distance is displayed on the display unit 502. Furthermore, by adjusting the object distance such that contrast of the desired object in the image signal generated by the image conversion unit 322 is maximized, a function of so-called autofocus can be implemented. Note that as shown in the third embodiment of the information compression unit described above, in a case where exposure control of the image capturing unit 121 (221) is performed, the control unit 505 may be provided with the function of the image capturing control unit 3116 to perform exposure control of the image capturing unit 121 (221) from the control unit 505.

The series of processes described in the specification can be executed by hardware, software, or a combined configuration of both hardware and software. In a case where processing by software is executed, a program recording the processing sequence is installed in a memory within a computer built in dedicated hardware and executed. Alternatively, the program can be installed and executed in a general-purpose computer that can execute various processes.

For example, the program can be recorded in advance in a hard disk, a solid state drive (SSD), or a read only memory (ROM) serving as a recording medium. Alternatively, the program can be temporarily or permanently stored (recorded) in a removable recording medium including a flexible disk, a compact disc read only memory (CD-ROM), a magneto optical (MO) disk, a digital versatile disc (DVD), a Blu-ray disc (BD) (registered trademark), a magnetic disk, a semiconductor memory card, and the like. Such a removable recording medium can be provided as so-called package software.

Furthermore, besides installation in a computer from a removable recording medium, the program may be transferred from a download site to a computer via a local area network (LAN) or the Internet and the like wirelessly or with a wire. The computer can receive the program transferred in this way and install the program on a recording medium such as a built-in hard disk.

Note that effects described in the present specification are merely illustrative and not restrictive, and additional effects that are not described may be produced. Furthermore, the present technology should not be construed as being limited to the embodiments of the technology described above. The embodiments of this technology disclose the present technology in the form of illustration. It is obvious that those skilled in the art can modify or substitute the embodiments without departing from the spirit of the present technology. That is, in order to determine the spirit of the present technology, the claims should be considered.

Furthermore, the information processing device of the present technology can also have the following configurations.

(1) An information processing device including: an information compression unit configured to perform compression processing to reduce an amount of data of pixel output information including a plurality of pixel outputs that is output from an image capturing element including the plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light.

(2) The information processing device according to (1), in which the information compression unit computes a difference between reference value information and the pixel outputs as the compression processing.

(3) The information processing device according to (2), in which the information compression unit sets the reference value information on the basis of the pixel outputs.

(4) The information processing device according to (2), in which the information compression unit sets, as the reference value information, each of the pixel outputs on which the compression processing has been performed immediately before.

(5) The information processing device according to any one of (1) to (4), in which the information compression unit classifies each of the plurality of pixel outputs into one of a plurality of classifications on the basis of the incident angle directivity, and performs the compression processing on each of the classifications.

(6) The information processing device according to (1), in which the information compression unit reduces a word length of the pixel outputs by performing linear calculation on a calculation parameter set on the basis of the pixel outputs and the pixel outputs.

(7) The information processing device according to (1), in which the information compression unit discriminates a compression word length indicating a word length of the pixel output information after the compression processing, and controls exposure on the basis of the compression word length.

(8) The information processing device according to (7), in which the information compression unit sets a difference between a maximum value and a minimum value of the pixel outputs as the compression word length.

(9) The information processing device according to any one of (1) to (8), in which the information compression unit performs the compression processing for each color component.

(10) The information processing device according to any one of (1) to (9), further including an image conversion unit configured to generate a reconstruction image by using one of the pixel output information that has undergone the compression processing by the information compression unit, the pixel output information after expansion processing of the pixel output information that has undergone the compression processing, and the pixel output information before the compression processing.

(11) The information processing device according to (10), further including a word length reconstruction unit configured to reconstruct a word length of the reconstruction image, in which the information compression unit discriminates a compression word length of the pixel output information, controls generation of the pixel outputs on the basis of a discrimination result, and sets the generated pixel output information as the compression word length, the image conversion unit generates the reconstruction image by using the pixel outputs that are set by the information compression unit as the compression word length, and the word length reconstruction unit reconstructs the reconstruction image generated by the image conversion unit to an image having the word length before the compression.

(12) The information processing device according to any one of (1) to (11), in which in the image capturing element, at least two of the plurality of pixel output units are different from each other in the incident angle directivity indicating directivity with respect to the incident angle of incident light from the object.

(13) The information processing device according to (12), in which each of the plurality of pixel output units includes one photodiode, each of the at least two pixel output units includes a light-shielding film that shields incidence of the object light on the photodiode, and a range in which the object light is shielded by the light-shielding film is different from each other between the at least two pixel output units.

(14) The information processing device according to (12), in which each of the at least two pixel output units includes a plurality of photodiodes, and the plurality of photodiodes differs from each other in degree of contribution to the output pixel value.

(15) The information processing device according to any one of (1) to (14), in which each of the plurality of pixel output units has a configuration that allows incident directivity with respect to the object light to be set independently.

INDUSTRIAL APPLICABILITY

According to the information processing device, the information processing method, the image capturing device, and the program of this technology, an information compression unit performs compression processing to reduce an amount of data of pixel output information including a plurality of pixel outputs that is output from an image capturing element including a plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light. Therefore, an amount of data in a case where an image capturing element of image capturing lens free is used can be reduced. Therefore, it is possible to improve the degree of freedom in designing the configuration for image capturing and to reduce the amount of data during image capturing.

REFERENCE SIGNS LIST

50 Image capturing device
121, 221 Image capturing unit
222 Image capturing element
223 Mask
223BW Black and white pattern mask
223LF Optical interference mask
300, 300a Information processing system
311, 311-1, 311-2, 311-3 Information compression unit
312 Recording unit
315 Recording reproduction unit
320 Reproduction unit
321 Information expansion unit
322 Image conversion unit
323 Coefficient storage unit
324 Word length reconstruction unit
501 Camera signal processing unit
502 Display unit
503 Output unit
504 User interface (I/F) unit
505 Control unit
3111 Reference setting unit
3112 Difference calculation unit
3113 Calculation parameter setting unit
3114 Linear calculation unit
3115 Word length discrimination unit
3116 Image capturing control unit
3221 Color component image conversion unit
3222 Coupling unit

The invention claimed is:

1. An information processing device, comprising:
processing circuitry configured to perform compression processing to reduce an amount of data of pixel output information including a plurality of pixel outputs that is output from an image capturing element including a plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light, wherein
the processing circuitry is configured to classify each of the plurality of pixel outputs into one of a plurality of classifications on a basis of the incident angle directivity, and to perform the compression processing on each of the classifications.

2. The information processing device according to claim 1, wherein
the processing circuitry is configured to compute a difference between reference value information and the pixel outputs as the compression processing.

3. The information processing device according to claim 2, wherein
the processing circuitry is configured to set the reference value information on a basis of the pixel outputs.

4. The information processing device according to claim 2, wherein
the processing circuitry is configured to set, as the reference value information, each of the pixel outputs on which the compression processing has been performed immediately before.

5. The information processing device according to claim 1, wherein
in the image capturing element, at least two of the plurality of pixel output units are different from each other in the incident angle directivity indicating directivity with respect to an incident angle of incident light from the object.

6. The information processing device according to claim 5, wherein
each of the plurality of pixel output units includes one photodiode,
each of the at least two pixel output units includes a light-shielding film that shields incidence of the object light on the photodiode, and
a range in which the object light is shielded by the light-shielding film is different from each other between the at least two pixel output units.

7. The information processing device according to claim 5, wherein
each of the at least two pixel output units includes a plurality of photodiodes, and the plurality of photodiodes differs from each other in degree of contribution to an output pixel value.

8. The information processing device according to claim 1, wherein
each of the plurality of pixel output units has a configuration that allows incident angle directivity with respect to the object light to be set independently.

9. An information processing device, comprising:
processing circuitry configured to perform compression processing to reduce an amount of data of pixel output information including a plurality of pixel outputs that is output from an image capturing element including a plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light, wherein
the processing circuitry is configured to reduce a word length of the pixel outputs by performing linear calculation on a calculation parameter set on a basis of the pixel outputs and the pixel outputs.

10. An information processing device, comprising: processing circuitry configured to perform compression processing to reduce an amount of data of pixel output information including a plurality of pixel outputs that is output from an image capturing element including a plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light, wherein
the processing circuitry is configured to determine a compression word length indicating a word length of the pixel output information after the compression processing, and to control exposure on a basis of the compression word length.

11. The information processing device according to claim 10, wherein
the processing circuitry is configured to set a difference between a maximum value and a minimum value of the pixel outputs as the compression word length.

12. An information processing device, comprising: processing circuitry configured to perform compression processing to reduce an amount of data of pixel output information including a plurality of pixel outputs that is output from an image capturing element including a plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light, wherein
the processing circuitry is configured to perform the compression processing for each color component.

13. An information processing device, comprising: processing circuitry configured to perform compression processing to reduce an amount of data of pixel output information including a plurality of pixel outputs that is output from an image capturing element including a plurality of pixel output units configured to receive object light that enters without passing through any of an image capturing lens and a pinhole, and among the plurality of pixel output units, the pixel outputs of at least two of the pixel output units have incident angle directivity modulated into different incident angle directivity according to an incident angle of the object light, wherein the processing circuitry is configured to
generate a reconstruction image by using one of the pixel output information that has undergone the compression processing, the pixel output information after expansion processing of the pixel output information that has undergone the compression processing, and the pixel output information before the compression processing.

14. The information processing device according to claim 13, wherein the processing circuitry is configured to
reconstruct a word length of the reconstruction image,
determine a compression word length of the pixel output information,
control generation of the pixel outputs on a basis of a determination result,
set the generated pixel output information as the compression word length,
generate the reconstruction image by using the pixel outputs that are set as the compression word length, and
reconstruct the reconstruction image to an image having the word length before the compression.

* * * * *